US011437089B2

United States Patent
Kang et al.

(10) Patent No.: US 11,437,089 B2
(45) Date of Patent: Sep. 6, 2022

(54) INTEGRATED CIRCUIT DEVICES

(71) Applicant: SAMSUNG ELECTRONICS CO., LTD., Suwon-si (KR)

(72) Inventors: Taesung Kang, Seoul (KR); Youngkyu Lee, Hwaseong-si (KR); Kyoungmin Kim, Namyangju-si (KR); Ilgweon Kim, Hwaseong-si (KR); Bokyeon Won, Namyangju-si (KR); Seokjae Lee, Gwangmyeong-si (KR); Sungho Jang, Seoul (KR); Joon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/245,334

(22) Filed: Apr. 30, 2021

(65) Prior Publication Data
US 2022/0076732 A1 Mar. 10, 2022

(30) Foreign Application Priority Data

Sep. 10, 2020 (KR) .................. 10-2020-0116217

(51) Int. Cl.
*G11C 11/4091* (2006.01)
*H01L 27/108* (2006.01)

(52) U.S. Cl.
CPC .... *G11C 11/4091* (2013.01); *H01L 27/10814* (2013.01); *H01L 27/10823* (2013.01); *H01L 27/10897* (2013.01)

(58) Field of Classification Search
CPC ........... G11C 11/4091; H01L 27/10814; H01L 27/10823; H01L 27/10897

USPC .................................. 365/149, 205
See application file for complete search history.

(56) References Cited

U.S. PATENT DOCUMENTS

| 5,293,328 A | 3/1994 | Amin et al. |
| 6,744,089 B2 | 6/2004 | Wu |
| 6,781,915 B2 | 8/2004 | Arimoto et al. |
| 6,818,993 B2 | 11/2004 | Ikemasu et al. |

(Continued)

FOREIGN PATENT DOCUMENTS

TW     201937487 A     9/2019

OTHER PUBLICATIONS

US 8,426,911 B2, 04/2013, Juengling (withdrawn)

(Continued)

*Primary Examiner* — Michael T Tran
(74) *Attorney, Agent, or Firm* — Sughrue Mion, PLLC

(57) ABSTRACT

An integrated circuit device includes a sense amplifier configured to sense a voltage change of a bit line, wherein the sense amplifier includes: a sense amplifier unit connected to the bit line and a complementary bit line, configured to sense the voltage change of the bit line in response to a control signal, configured to adjust voltages of a sensing bit line and a complementary sensing bit line based on the sensed voltage change, and including a first PMOS transistor and a first NMOS transistor; and a first offset canceling unit connecting the bit line to the complementary sensing bit line in response to an offset canceling signal, and including a first offset canceling transistor arranged between the first NMOS transistor and the first PMOS transistor, wherein the first offset canceling transistor shares a common impurity region with the first NMOS transistor.

19 Claims, 20 Drawing Sheets

(56) References Cited

U.S. PATENT DOCUMENTS

| | | | |
|---|---|---|---|
| 7,012,450 B1* | 3/2006 | Oner | H04L 25/0276 |
| | | | 326/86 |
| 7,102,914 B2 | 9/2006 | Chen et al. | |
| 7,145,242 B2 | 12/2006 | Ikemasu et al. | |
| 7,485,525 B2 | 2/2009 | Cheng et al. | |
| 7,668,003 B2 | 2/2010 | Barth, Jr. et al. | |
| 7,902,598 B2 | 3/2011 | Juengling | |
| 8,059,471 B2 | 11/2011 | Lueng | |
| 8,391,078 B2 | 3/2013 | Leung | |
| 8,933,508 B2 | 1/2015 | Juengling | |
| 9,761,712 B1 | 9/2017 | Anderson et al. | |
| 9,899,381 B2 | 2/2018 | Shimbo | |
| 10,147,796 B1 | 12/2018 | Vacula et al. | |
| 10,211,205 B2 | 2/2019 | Den Hartog et al. | |
| 10,224,812 B1* | 3/2019 | Sen | H02M 3/158 |
| 10,497,428 B2 | 12/2019 | Kim et al. | |
| 10,823,767 B1* | 11/2020 | Ishida | H03K 5/1252 |
| 2006/0258060 A1 | 11/2006 | Chen et al. | |
| 2007/0052012 A1 | 3/2007 | Forbes | |
| 2009/0179890 A1* | 7/2009 | Nishimura | G09G 3/3688 |
| | | | 345/214 |
| 2013/0049655 A1* | 2/2013 | Takai | H02P 21/22 |
| | | | 318/400.02 |
| 2014/0098271 A1* | 4/2014 | Hagihara | H04N 5/37455 |
| | | | 348/302 |
| 2014/0153313 A1* | 6/2014 | Boujamaa | G11C 7/14 |
| | | | 365/148 |
| 2015/0063012 A1* | 3/2015 | Jung | G11C 11/1673 |
| | | | 365/158 |
| 2015/0228322 A1* | 8/2015 | Jung | G11C 7/08 |
| | | | 365/158 |
| 2017/0069368 A1* | 3/2017 | Woo | G11C 11/4091 |
| 2018/0182449 A1* | 6/2018 | Kim | G11C 5/025 |
| 2019/0068144 A1* | 2/2019 | Puscasu | H03F 1/0233 |
| 2019/0189186 A1 | 6/2019 | Won et al. | |
| 2019/0286180 A1* | 9/2019 | Sakaguchi | G05F 1/575 |
| 2020/0066727 A1 | 2/2020 | Sukekawa | |
| 2020/0081475 A1* | 3/2020 | Marinca | G05F 3/20 |
| 2020/0118614 A1 | 4/2020 | Kim et al. | |
| 2020/0160901 A1 | 5/2020 | Boujamaa et al. | |
| 2020/0396403 A1* | 12/2020 | Ebihara | H04N 5/3658 |
| 2021/0067168 A1* | 3/2021 | Kitano | H04N 5/378 |
| 2021/0075370 A1* | 3/2021 | Edelson | H03F 1/0272 |

OTHER PUBLICATIONS

Communication dated May 9, 2022 issued by the Taiwanese Patent Office in TW Application No. 110131262.

Search Report dated May 9, 2022 issued by the Taiwanese Patent Office in TW Application No. 110131262.

* cited by examiner

A2 - A2'

INTEGRATED CIRCUIT DEVICES

CROSS-REFERENCE TO THE RELATED APPLICATION

This application is based on and claims priority under 35 U.S.C. § 119 to Korean Patent Application No. 10-2020-0116217, filed on Sep. 10, 2020 in the Korean Intellectual Property Office, the disclosure of which is incorporated by reference herein in its entirety.

BACKGROUND

The disclosure relates to an integrated circuit device, and more specifically, to an integrated circuit device including a sense amplifier.

As electronic products are required to be miniaturized, multifunctional, and of high-performance, high-capacity integrated circuit devices are required, and to provide high-capacity integrated circuit devices, an increased degree of integration is required. As a feature size of a memory device such as a DRAM device decreases, gate lengths of transistors for driving a memory device, for example, transistors constituting a sense amplifier, may decrease or a threshold voltage deviation of the transistors may occur. As a result, there may be an issue that offset noise of the sense amplifier occurs.

SUMMARY

The disclosure provides an integrated circuit device of excellent electrical characteristics in which a sense amplifier has a relatively low and relatively uniform threshold voltage even when a feature size of a memory device is reduced.

According to an aspect of the disclosure, an integrated circuit device includes a sense amplifier configured to sense a voltage change of a bit line, wherein the sense amplifier includes a sense amplifier unit connected to the bit line and a complementary bit line, the sense amplifier unit being configured to sense the voltage change of the bit line in response to a control signal and adjust voltages of a sensing bit line and a complementary sensing bit line based on the sensed voltage change, the sense amplifier unit including a first PMOS transistor and a first NMOS transistor; and a first offset canceling unit connecting the bit line to the complementary sensing bit line in response to an offset canceling signal, the first offset canceling unit including a first offset canceling transistor arranged between the first NMOS transistor and the first PMOS transistor, wherein the first offset canceling transistor shares a common impurity region with the first NMOS transistor.

According to an aspect of the disclosure, an integrated circuit device includes a sense amplifier configured to sense a voltage change of a bit line, wherein the sense amplifier includes a sense amplifier unit connected to the bit line and a complementary bit line, the sense amplifier unit being configured to sense the voltage change of the bit line in response to a control signal and adjust voltages of a sensing bit line and a complementary sensing bit line based on the sensed voltage change, the sense amplifier unit including a first NMOS transistor; and a first offset canceling unit connecting the bit line to the complementary sensing bit line in response to an offset canceling signal, the first offset canceling unit including a first offset canceling transistor arranged adjacent to the first NMOS transistor, wherein the first NMOS transistor includes a first gate pattern arranged on a first active region of a substrate, the first gate pattern including a pair of first sidewalls extending in a first direction in parallel with an upper surface of the substrate and a pair of second sidewalls extending in a second direction in parallel with the upper surface of the substrate; a first impurity region arranged in a first upper portion of the substrate and adjacent to one first sidewall of the pair of first sidewalls of the first gate pattern; and a common impurity region arranged in a second upper portion of the substrate and adjacent to one second sidewall of the pair of second sidewalls of the first gate pattern.

According to an aspect of the disclosure, an integrated circuit device includes a sense amplifier configured to sense a voltage change of a bit line, wherein the sense amplifier includes a sense amplifier unit connected to the bit line and a complementary bit line, the sense amplifier unit being configured to sense the voltage change of the bit line in response to a control signal and adjust voltages of a sensing bit line and a complementary sensing bit line based on the sensed voltage change, the sense amplifier unit including a first PMOS transistor, a second PMOS transistor, a first NMOS transistor, and a second NMOS transistor; and a first offset canceling unit connecting the bit line to the complementary sensing bit line in response to an offset canceling signal, the first offset canceling unit including a first offset canceling transistor arranged adjacent to the first NMOS transistor, wherein the first PMOS transistor is connected between a first control signal line and the complementary sensing bit line, wherein a first gate pattern of the first PMOS transistor is connected to the sensing bit line, wherein the second PMOS transistor is connected between the first control signal line and the sensing bit line, wherein a second gate pattern of the second PMOS transistor is connected to the complementary sensing bit line, wherein the first NMOS transistor is connected between a second control signal line and the complementary sensing bit line, wherein a third gate pattern of the first NMOS transistor is connected to the bit line, wherein the second NMOS transistor is connected between the second control signal line and the sensing bit line, wherein a fourth gate pattern of the second NMOS transistor is connected to the complementary bit line, and wherein the first NMOS transistor includes the third gate pattern arranged on a first active region of a substrate, the third gate pattern including a pair of first sidewalls extending in a first direction in parallel with an upper surface of the substrate and a pair of second sidewalls extending in a second direction in parallel with the upper surface of the substrate; a first impurity region arranged in a first upper portion of the substrate and adjacent to one first sidewall of the pair of first sidewalls of the third gate pattern; and a common impurity region arranged in a second upper portion of the substrate and adjacent to one second sidewall of the pair of second sidewalls of the third gate pattern.

BRIEF DESCRIPTION OF THE DRAWINGS

Embodiments will be more clearly understood from the following detailed description taken in conjunction with the accompanying drawings in which.

DETAILED DESCRIPTION OF EMBODIMENTS

Hereinafter, example embodiments are described in detail in conjunction with the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
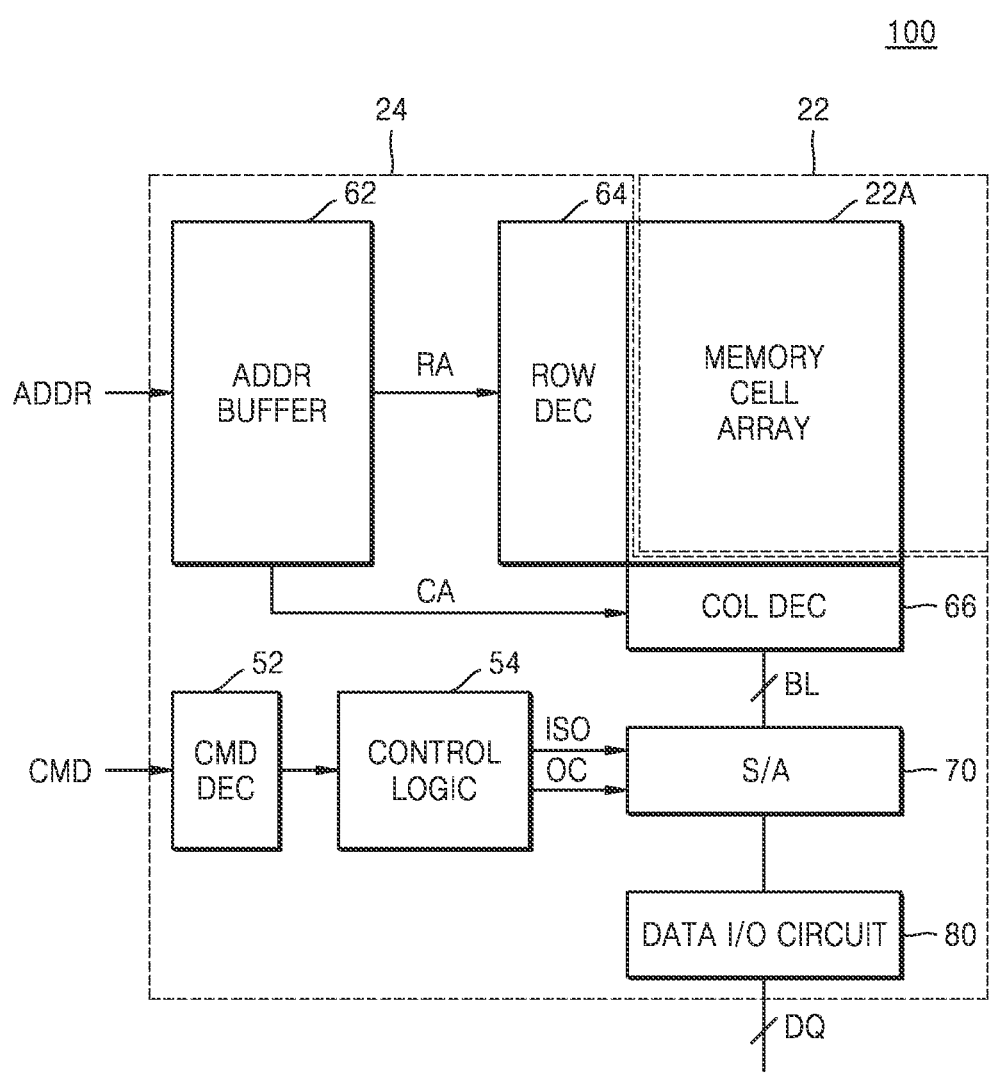
FIG. 1 is a block diagram illustrating an example configuration of an integrated circuit device, according to an embodiment.

FIG. 1 is a block diagram illustrating an example configuration of an integrated circuit device 100, according to an example embodiment.

Referring to FIG. 1, the integrated circuit device 100 may include a first region 22 and a second region 24. The integrated circuit device 100 may include a storage device based on a semiconductor device. For example, the integrated circuit device 100 may include a volatile memory such as dynamic random-access memory (RAM) (DRAM), synchronous DRAM (SDRAM), double data rate (DDR) SDRAM (DDR SDRAM), low power double data rate SDRAM (LPDDR SDRAM), graphics DDR (GDDR) synchronous DRAM (SDRAM) (GDDR SDRAM), DDR3 SDRAM, DDR4 SDRAM, and thyristor RAM (TRAM), and a non-volatile memory such as phase change RAM (PRAM), magnetic RAM (MRAM), and resistive RAM (RRAM).

In some embodiments, the first region 22 may include a memory cell area of a DRAM device, and the second region 24 may include a periphery circuit area of the DRAM device. The first region 22 may include a memory cell array 22A.

The second region 24 may output data via data lines DQ in response to a command CMD, an address ADDR, and control signals that are received from an external device, for example, a memory controller. The integrated circuit device 100 may include a command decoder 52, a control logic 54, an address buffer 62, a row decoder 64, a column decoder 66, a sense amplifier 70, and a data input/output circuit 80.

The memory cell array 22A may include a plurality of memory cells provided in a matrix form arranged in a plurality of rows and columns. The memory cell array 22A may include a plurality of word lines WL (refer to FIG. 3) and a plurality of bit lines BL (refer to FIG. 1), which are connected to the memory cells. The plurality of word lines WL may be connected to the rows of the memory cells, and the plurality of bit lines BL may be connected to the columns of the memory cells.

The command decoder 52 may decode a write enable signal /WE, a row address strobe signal /RAS, a column address strobe signal /CAS, a chip select signal /CS, and the like that are received from an external device, for example, the memory controller, so that control signals corresponding to the command CMD are generated by the control logic 54. The command CMD may include an active command, a read command, a write command, a precharge command, and the like.

The address buffer 62 may receive the address ADDR from the memory controller, which is the external device. The address ADDR may include a row address RA addressing the row of the memory cell array 22A and a column address CA addressing the column of the memory cell array 22A. The address buffer 62 may provide the row address RA to the row decoder 64 and the column address CA to the column decoder 66.

The row decoder 64 may select any one of the plurality of word lines WL connected to the memory cell array 22A. The row decoder 64 may decode the row address RA received from the address buffer 62, select any one word line WL corresponding to the row address RA, and activate the selected word line WL.

The column decoder 66 may select any one bit line BL of the plurality of bit lines BL of the memory cell array 22A. The column decoder 66 may decode the column address CA received from the address buffer 62, and select a certain bit line BL corresponding to the column address CA.

The sense amplifier 70 may be connected to the bit lines BL of the memory cell array 22A. The sense amplifier 70 may sense a voltage change of the selected bit line of the plurality of bit lines BL, and amplify and output the sensed voltage change. The data input/output circuit 80 may output data based on a voltage that has been sensed and amplified from the sense amplifier 70 to the outside via the data lines DQ.

The sense amplifier 70 may receive an isolation signal ISO and an offset canceling signal OC from the control logic 54. The sense amplifier 70 may perform an offset canceling operation according to the isolation signal ISO and the offset canceling signal OC. For example, an offset may be referred to as a difference in characteristics, for example, a threshold voltage between semiconductor elements constituting the sense amplifier 70. As shown, e.g., in FIG. 3, the sense amplifier 70 may include an NMOS transistor and an offset canceling transistor, which share a common impurity region. Because the NMOS transistor and the offset canceling transistor included in the sense amplifier 70 share the common impurity region, the NMOS transistor may have a relatively low uniform threshold.

In the integrated circuit device 100 according to example embodiments, as the sense amplifier 70 performs an offset canceling operation, an effective sensing margin of the sense amplifier 70 may be improved.

Figure 2:
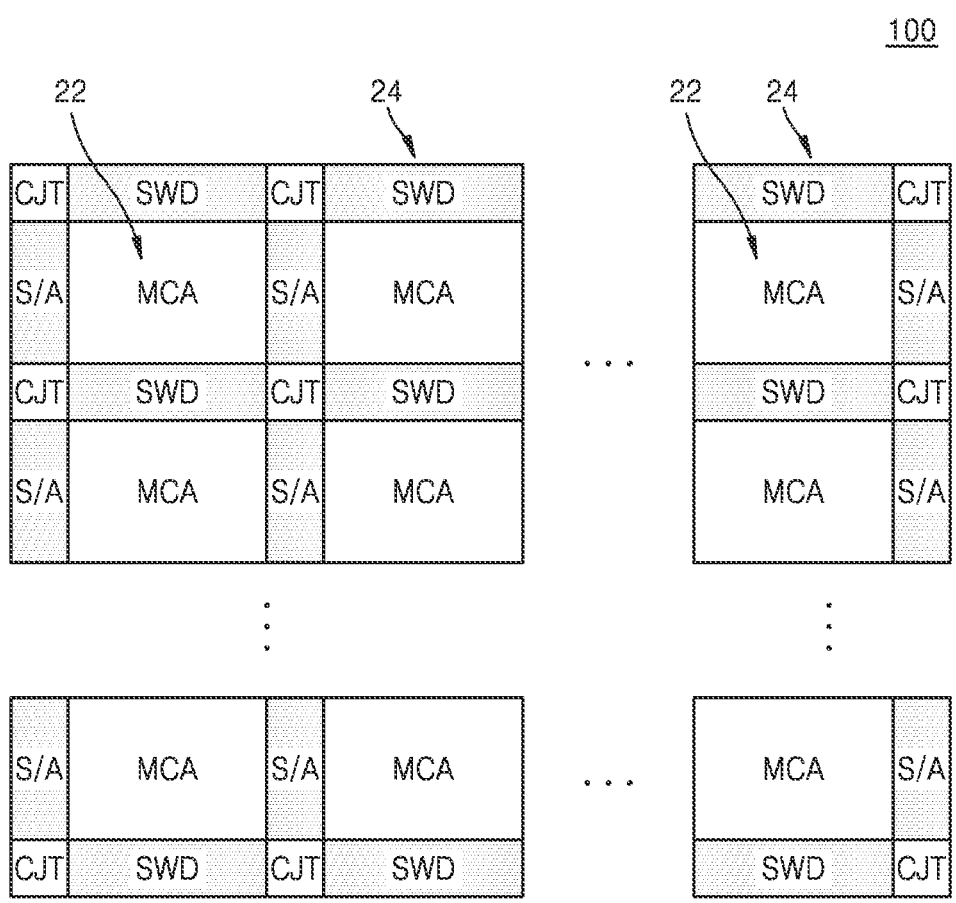
FIG. 2 is a plan view of an example arrangement configuration of an integrated circuit device, according to an embodiment.

FIG. 2 is a plan view of an example arrangement configuration of the integrated circuit device 100, according to an example embodiment.

Referring to FIG. 2, the integrated circuit device 100 may include a plurality of first regions 22. Each of the plurality of first regions 22 may be surrounded by the second region 24. In some example embodiments, each of the plurality of first regions 22 may include a cell array area MCA of a DRAM element, and the second region 24 may include an area and a core area (hereinafter, referred to as a "periphery circuit area") in which periphery circuits of the DRAM element are formed.

The second region 24 may include a sub-word line driver block SWD, a sense amplifier block S/A, and a conjunction block CJT. A plurality of sense amplifiers 70 (refer to FIG. 1) may be arranged in the sense amplifier block S/A. The conjunction block CJT may be at an intersection of the sub-word line driver block SWD and the sense amplifier block S/A. Power drivers and ground drivers for driving the sense amplifier 70 may be alternately arranged in the conjunction block CJT. In the second region 24, a periphery circuit such as an inverter chain and an input/output circuit may be further formed.

Figure 3:
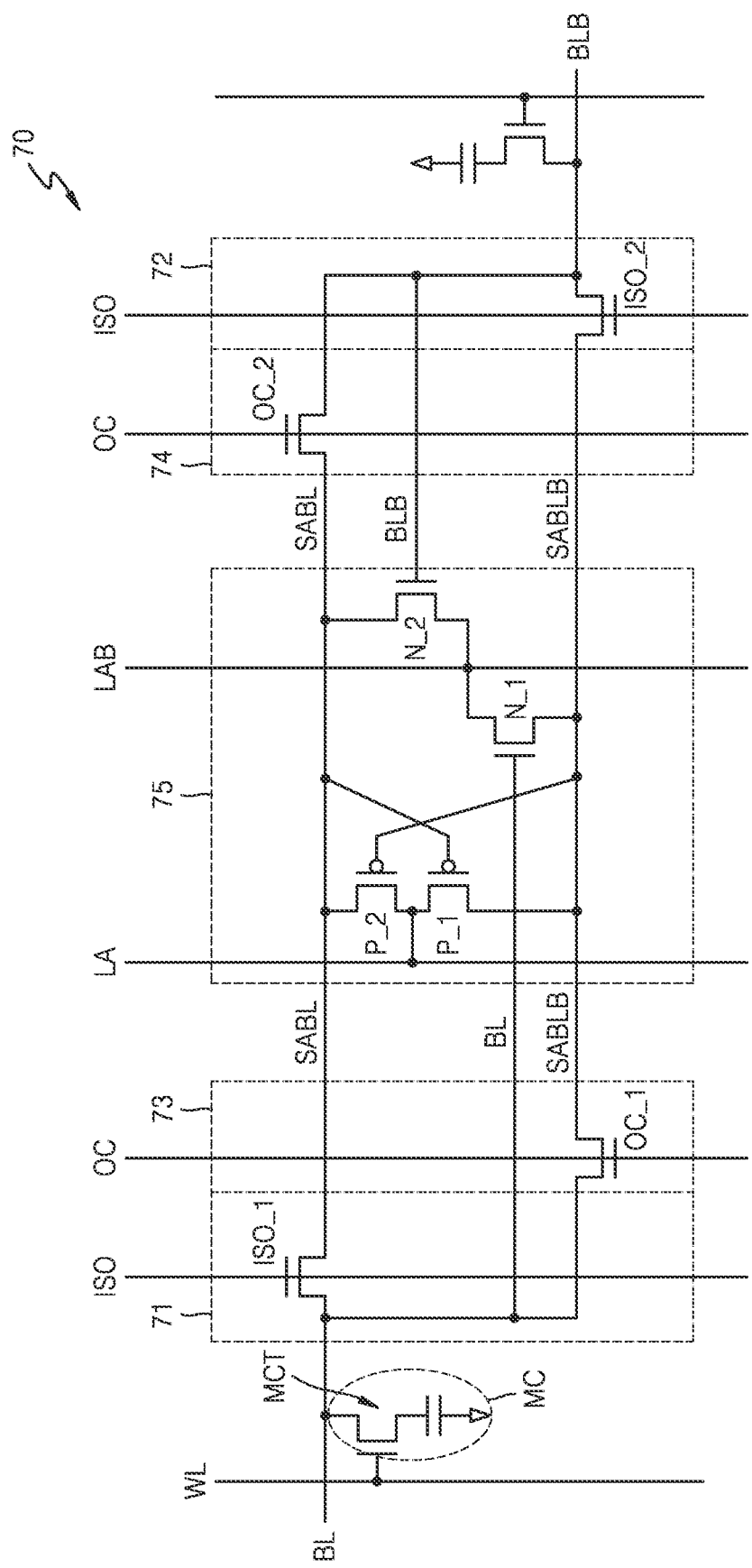
FIG. 3 is a circuit diagram of a sense amplifier according to an embodiment.
Figure 4:
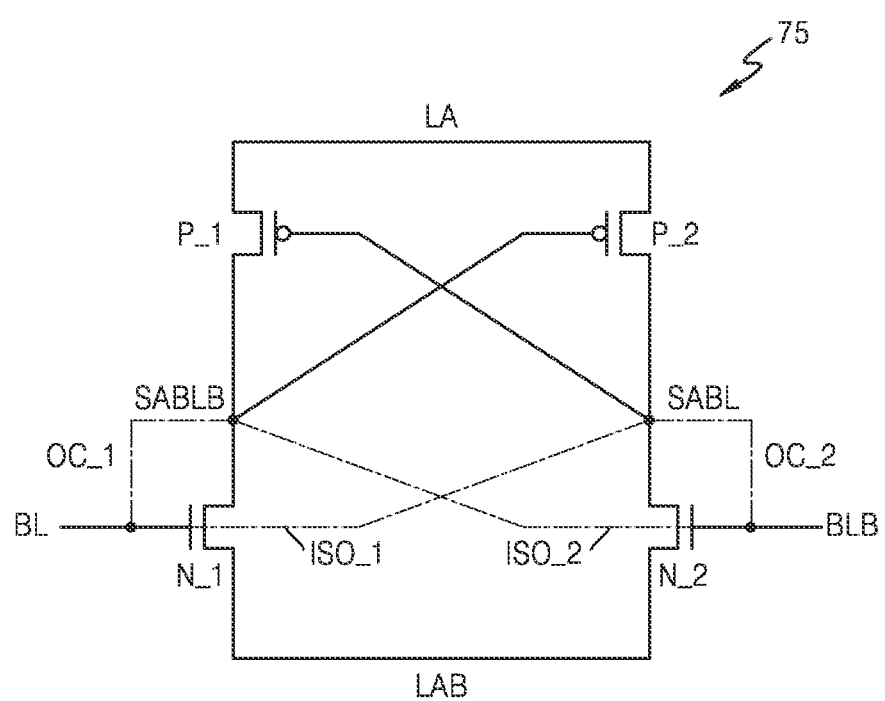
FIG. 4 is an equivalent circuit diagram of a sense amplifier unit according to an embodiment.

FIG. 3 is a circuit diagram of the sense amplifier 70 according to an example embodiment. FIG. 4 is an equivalent circuit diagram of a sense amplifier unit 75.

Referring to FIGS. 3 and 4, the sense amplifier 70 may include first and second isolation units 71 and 72, first and second offset canceling units 73 and 74, and the sense amplifier unit 75.

The first isolation unit 71 may be connected between the bit line BL and a sensing bit line SABL, and the second isolation unit 72 may be connected between a complementary bit line BLB and a complementary sensing bit line SABLB. The first and second isolation units 71 and 72 may receive the isolation signal ISO, and operate in response to the isolation signal ISO.

The first isolation unit 71 may include a first isolation transistor ISO_1 that connects or blocks between the bit line BL and the sensing bit line SABL in response to the isolation signal ISO. One end of the first isolation transistor ISO_1 may be connected to the bit line BL, the other end thereof may be connected to the sensing bit line SABL, and a gate thereof may be connected to a line of the isolation signal ISO.

The second isolation unit 72 may include a second isolation transistor ISO_2 that connects or blocks between the complementary bit line BLB and the complementary sensing bit line SABLB in response to the isolation signal ISO. One end of the second isolation transistor ISO_2 may be connected to the complementary bit line BLB, the other end thereof may be connected to the complementary sensing bit line SABLB, and a gate thereof may be connected to a line of the isolation signal ISO.

The first offset canceling unit 73 may be connected between the bit line BL and the complementary sensing bit line SABLB, and the second offset canceling unit 74 may be connected between the complementary bit line BLB and the sensing bit line SABL. The first and second offset canceling units 73 and 74 may receive the offset canceling signal OC, and operate in response to the offset canceling signal OC.

The first offset canceling unit 73 may include a first offset canceling transistor OC_1 for connecting or blocking between the bit line BL and the complementary sensing bit line SABLB in response to the offset canceling signal OC. One end of the first offset canceling transistor OC_1 may be connected to the bit line BL, the other end thereof may be connected to the complementary sensing bit line SABLB, and a gate thereof may be connected to the offset canceling signal OC.

The second offset canceling unit 74 may include a second offset canceling transistor OC_2 connecting or blocking between the complementary bit line BLB and the sensing bit line SABL in response to the offset canceling signal OC. One end of the second offset canceling transistor OC_2 may be connected to the complementary bit line BLB, the other end thereof may be connected to the sensing bit line SABL, and a gate thereof may be connected to the offset canceling signal OC.

The sense amplifier unit 75 may be connected between the sensing bit line SABL and the complementary sensing bit line SABLB, and may detect and amplify a voltage difference between the bit line BL and the complementary bit line BLB according to first and second control signals LA and LAB. The sense amplifier unit 75 may include first and second PMOS transistors P_1 and P_2 and first and second NMOS transistors N_1 and N_2.

One end of the first PMOS transistor P_1 may be connected to the complementary sensing bit line SABLB, the other end thereof may be connected to a line of the first control signal LA, and a gate thereof may be connected to the sensing bit line SABL. One end of the second PMOS transistor P_2 may be connected to the sensing bit line SABL, the other end thereof may be connected to a line of the first control signal LA, and a gate thereof may be connected to the complementary sensing bit line SABLB.

One end of the first NMOS transistor N_1 may be connected to the complementary sensing bit line SABLB, the other end thereof may be connected to a line of the second control signal LAB, and a gate thereof may be connected to the bit line BL. One end of the first NMOS transistor N_1 may be connected to the complementary sensing bit line SABLB and the other end of the first offset canceling transistor OC_1 may be connected to the complementary sensing bit line SABLB. The first NMOS transistor N_1 and the first offset canceling transistor OC_1 may share a common impurity region SDC (refer to FIG. 6). For example, one end of the first NMOS transistor N_1 and the other end of the first offset canceling transistor OC_1 may include a portion of the same active region (for example, a common impurity region SDC1).

One end of the second NMOS transistor N_2 may be connected to the sensing bit line SABL, the other end thereof may be connected to a line of the second control signal LAB, and a gate thereof may be connected to the complementary bit line BLB. One end of the second NMOS transistor N_2 may be connected to the sensing bit line SABL, and the other end of the second offset canceling transistor OC_2 may be connected to the sensing bit line SABL. The second NMOS transistor N_2 and the second offset canceling transistor OC_2 may share a common impurity region. For example, one end of the second NMOS transistor N_2 and the other end of the second offset canceling transistor OC_2 may include a portion of the same active region (for example, a first common impurity region SDC2).

The bit line BL may be connected to one end of a cell transistor MCT included in a memory cell MC. The word line WL may be connected to a gate of the cell transistor MCT.

Figure 5:
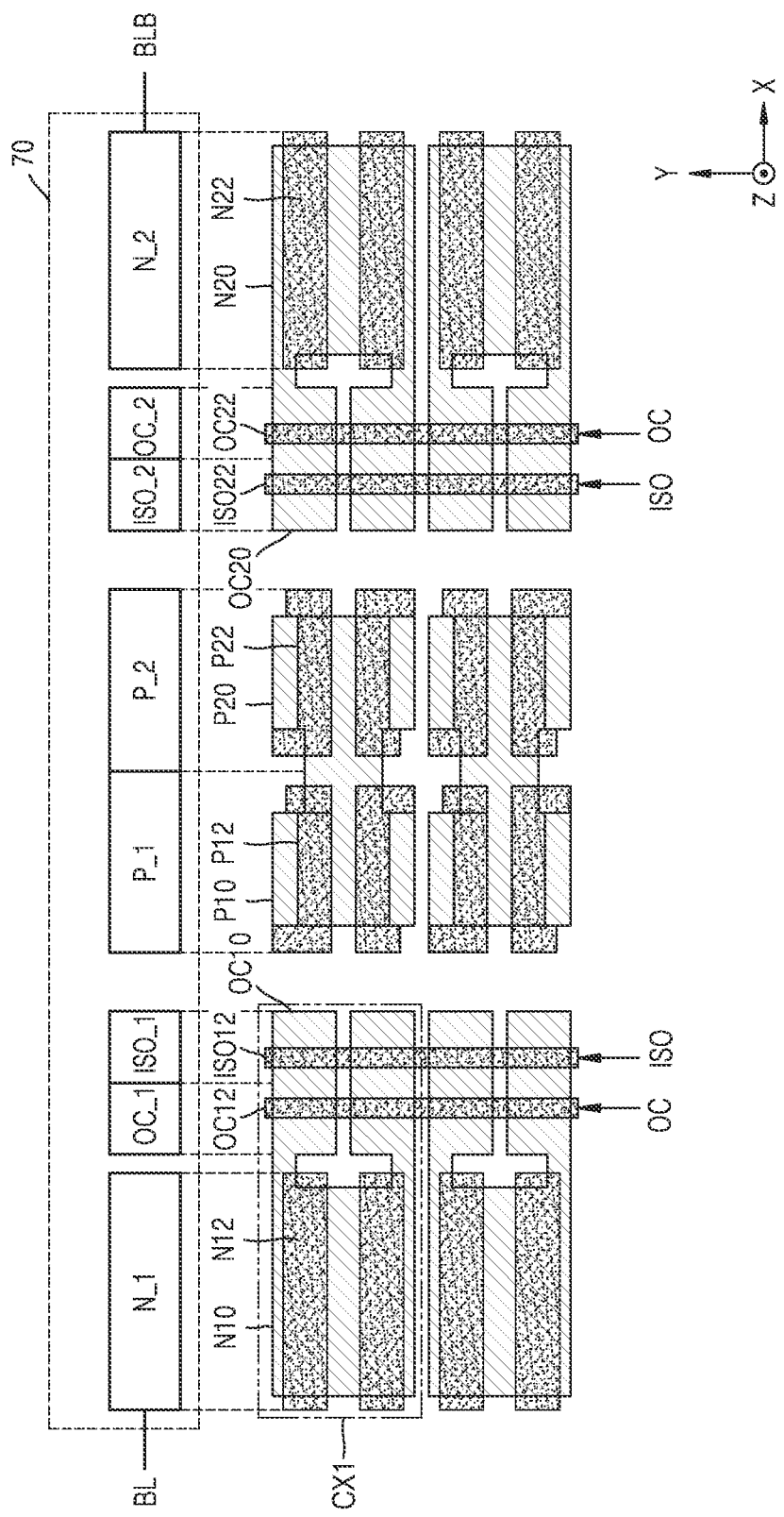
FIG. 5 is a schematic diagram illustrating an arrangement of a sense amplifier, according to an embodiment.
Figure 6:
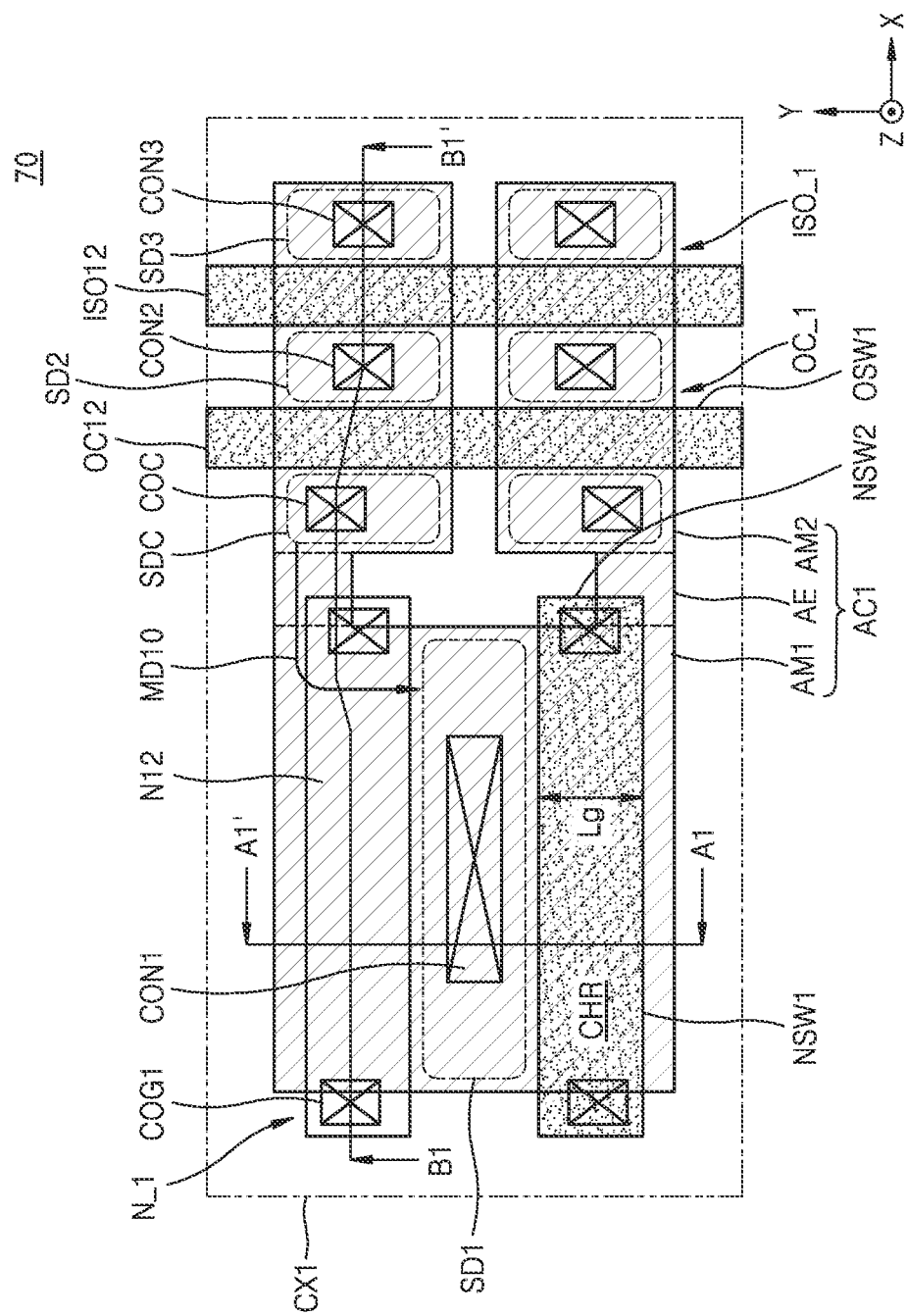
FIG. 6 is an enlarged diagram of a region CX1 in FIG. 5.
Figure 7:
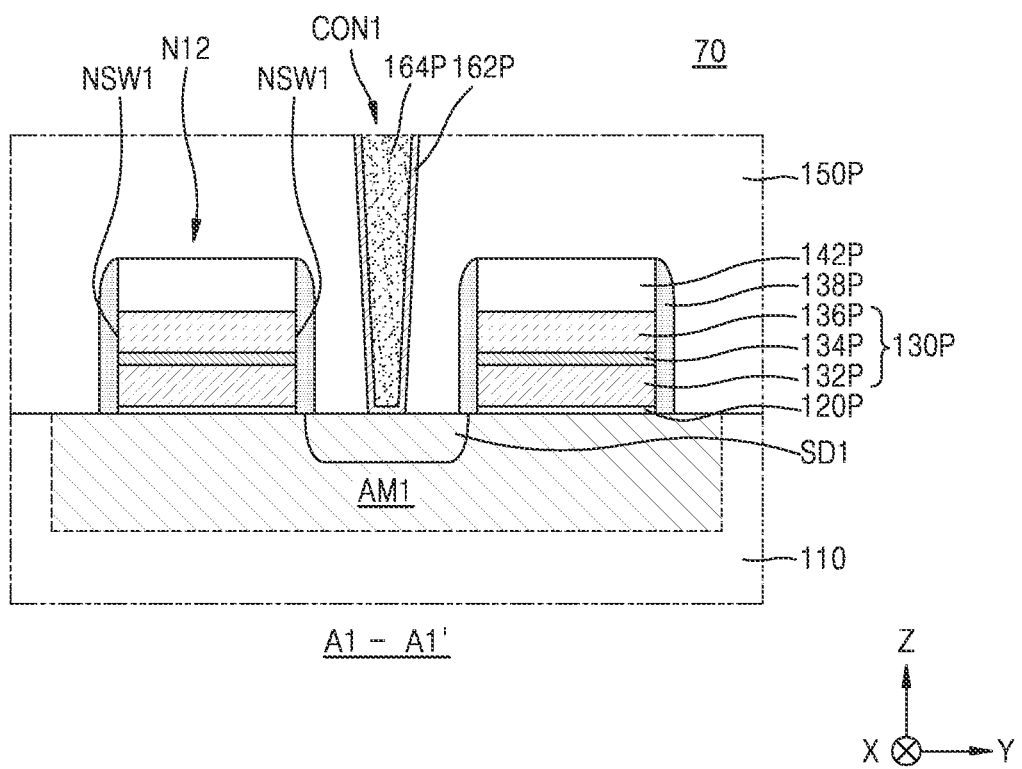
FIG. 7 is a cross-sectional view taken along line A1-A1' in FIG. 6.
Figure 8:
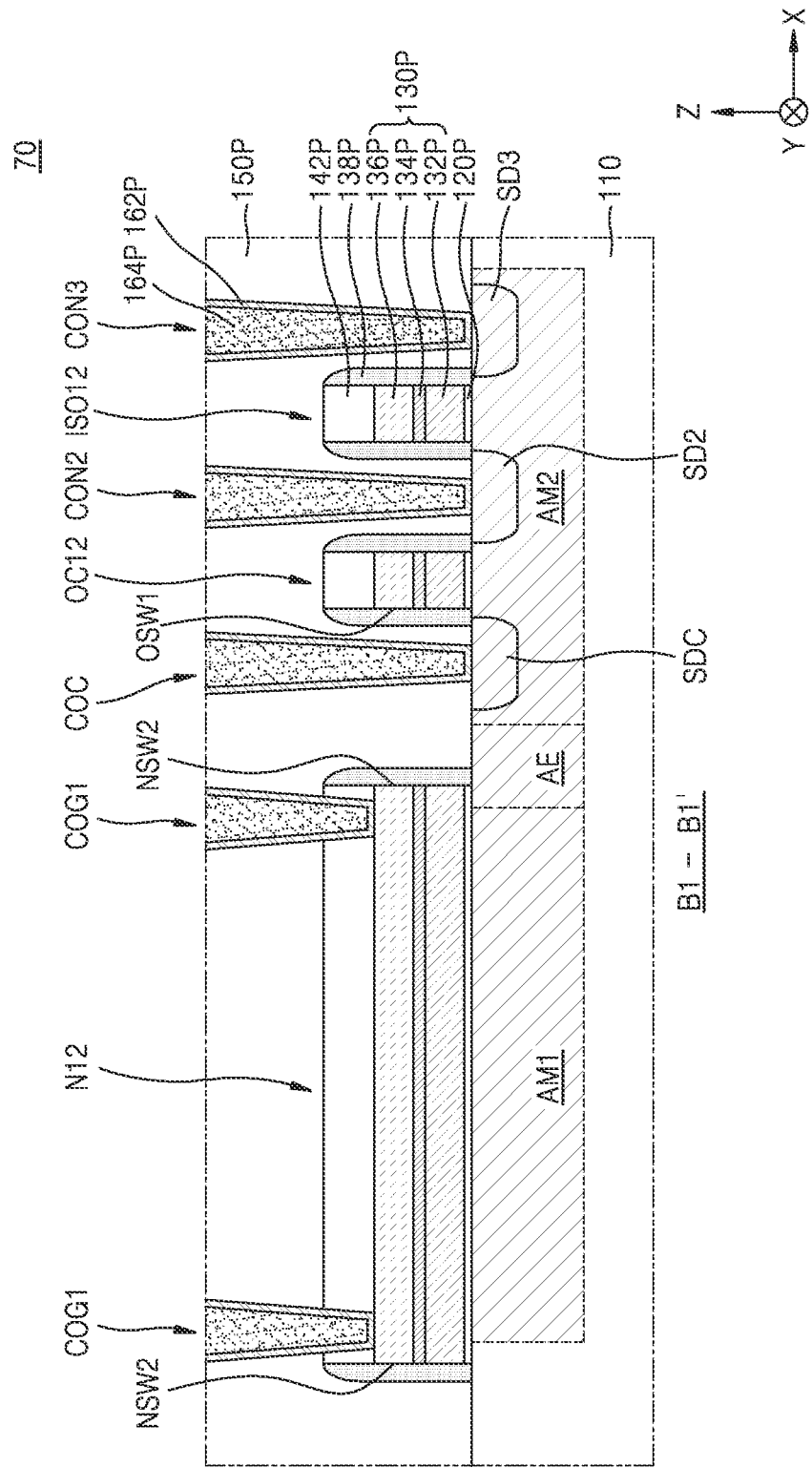
FIG. 8 is a cross-sectional view taken along line B1-B1' in FIG. 6.

FIG. 5 is a schematic diagram illustrating an arrangement of the sense amplifier 70, according to an example embodiment. FIG. 6 is an enlarged view of a region CX1 in FIG. 5, FIG. 7 is a cross-sectional view taken along line A1-A1' in FIG. 6, and FIG. 8 is a cross-sectional view taken along line B1-B1' in FIG. 6.

Referring to FIGS. 5 through 8, the sense amplifier 70 may be arranged between the bit line BL and the complementary bit line BLB. The first and second PMOS transistors P_1 and P_2 may be arranged at the center portion of the sense amplifier 70, and at either side portion of the sense amplifier 70, the first NMOS transistor N_1 may be arranged adjacent to the bit line BL and the second NMOS transistor N_2 may be arranged adjacent to the complementary bit line BLB.

The first PMOS transistor P_1 may include an active region P10 and a gate pattern P12, and the second PMOS transistor P_2 may include an active region P20 and a gate pattern P22. The active region P10 of the first PMOS transistor P_1 may be connected to the active region P20 of the second PMOS transistor P_2, but is not limited thereto.

The first NMOS transistor N_1 may include an active region N10 and a first gate pattern N12, and the second NMOS transistor N_2 may include an active region N20 and a second gate pattern N22.

A first offset canceling transistor OC_1 and a first isolation transistor ISO_1 may be arranged between the first NMOS transistor N_1 and the first PMOS transistor P_1. The first offset canceling transistor OC_1 may be arranged adjacent to the first NMOS transistor N_1, and the first isolation transistor ISO_1 may be arranged adjacent to the first PMOS transistor P_1. The first offset canceling transistor OC_1 may include an active region OC10 and a first offset canceling gate pattern OC12, and the first isolation transistor ISO_1 may include the active region OC10 and a first isolation gate pattern ISO12.

The active region OC10 of the first offset canceling transistor OC_1 may be connected to the active region N10 of the first NMOS transistor N_1. In this case, the active region OC10 may not be separated from but integrally formed with the active region N10. The active region OC10 and the active region N10 may be doped with impurity ions therein, and indicate upper portions of a substrate 110 having a certain impurity concentration.

A second offset canceling transistor OC_2 and a second isolation transistor ISO_2 may be arranged between the second NMOS transistor N_2 and the second PMOS transistor P_2. The second offset canceling transistor OC_2 may be arranged adjacent to the second NMOS transistor N_2, and the second isolation transistor ISO_2 may be arranged adjacent to the second PMOS transistor P_2. The second offset canceling transistor OC_2 may include an active region OC20 and a second offset canceling gate pattern OC22, and the second isolation transistor ISO_2 may include the active region OC20 and a second isolation gate pattern ISO22.

The active region OC20 of the second offset canceling transistor OC_2 may be connected to the active region N20 of the second NMOS transistor N_2. In this case, the active region OC20 may not be separated from but integrally formed with the active region N20.

The offset canceling signal OC may be transferred to the first and second offset canceling gate patterns OC12 and OC22, and the isolation signal ISO may be transferred to the first and second isolation gate patterns ISO12 and ISO22.

FIG. 5 illustrates an example in which the first NMOS transistor N_1, a first offset canceling transistor OC_1, a first isolation transistor ISO_1, the first PMOS transistor P_1, the second PMOS transistor P_2, and a second isolation transistor ISO 2, a second offset canceling transistor OC_2, and the second NMOS transistor N_2 are arranged in order in a first direction X, and four sets of these transistors are arranged in a second direction Y. Two first NMOS transistors N_1 adjacent to each other in the second direction Y may share the active region N10, and two second NMOS transistors N_2 adjacent to each other in the second direction Y may share the active region N20. Two first PMOS transistors P_1 adjacent to each other in the second direction Y may share the active region P10, and two second PMOS transistors P_2 adjacent to each other in the second direction Y may share the active region P20. However, the disclosure is not limited thereto.

As illustrated in FIG. 6, for example, a first active region AC1 may be defined in the substrate 110. The first active region AC1 may be a region formed by doping an upper portion of the substrate 110 with impurity ions, and the active region N10 of the first NMOS transistor N_1 and the active region OC10 of the first offset canceling transistor OC_1 illustrated in FIG. 5 may be collectively referred to as the first active region AC1.

The first active region AC1 may include a first main active region AM1, a second main active region AM2, and an extended active region AE. The extended active region AE may be arranged between the first main active region AM1 and the second main active region AM2.

The first gate pattern N12 may extend in a relatively long length in the first direction X on the first main active region AM1 (see FIG. 6), and the first offset canceling gate pattern OC12 on the second main active region AM2 may extend in a relatively long length in the second direction Y. A width of (i.e., a distance across) the extended active region AE in the second direction Y may be less than a width of (i.e., a distance across) the first main active region AM1 in the second direction Y or a width of (i.e., a distance across) the second main active region AM2 in the second direction Y.

A channel region CHR may be formed in a portion of the first main active region AM1 that vertically overlaps the first gate pattern N12. In some embodiments, when the substrate 110 includes a portion of a wafer having a crystallographic orientation according to the crystallographic {001} plane of silicon, a channel direction of the channel region CHR may be the <100> direction (for example, [100] and [010] directions). In some embodiments, when the substrate 110 includes a portion of a wafer having a crystallographic orientation according to the crystallographic {110} plane of silicon, a channel direction of the channel region CHR may be the <110> direction (for example, [110] direction). However, the channel direction of the channel region CHR is not limited thereto.

The active region N10 of the first NMOS transistor N_1 may correspond to the first main active region AM1, and the active region OC10 of the first offset canceling transistor OC_1 may correspond to the second main active region AM2. As described above, the two first NMOS transistors N_1 may share the active region N10 in the second direction Y, and accordingly, two first gate patterns N12 may be arranged apart from each other in the first main active region AM1 in the second direction Y. In addition, two first offset canceling transistors OC_1 adjacent to each other in the second direction Y may not share the active region OC10, and may share the first offset canceling gate pattern OC12. Accordingly, the two second main active regions AM2 may be arranged apart from each other in the second direction Y, and one first offset canceling gate pattern OC12 may extend to intersect with or overlap both of the two second main active regions AM2 in the second direction Y.

The first gate pattern N12 may include a pair of first side walls NSW1 extending in the first direction X and being apart from each other in the second direction Y, and a pair of second side walls NSW2 extending in the second direction Y and being apart from each other in the first direction X. A first impurity region SD1 may be arranged in the first main active region AM1 that is arranged adjacent to one first sidewall NSW1 of the first gate pattern N12. For example, the first impurity region SD1 may include a high concentration doping region doped with N-type impurities. The first impurity region SD1 may correspond to a source region or drain region of the first NMOS transistor N_1. A first contact CON1 may be arranged on the first impurity region SD1 as shown in FIG. 6.

The common impurity region SDC may be arranged in the second main active region AM2 that is arranged adjacent to one second sidewall NSW2 of the first gate pattern N12. The common impurity region SDC may correspond to the source region or drain region of the first NMOS transistor N_1. A common contact COC may be arranged on the common impurity region SDC.

As illustrated in FIG. 6, for example, the first impurity region SD1 and the common impurity region SDC may be arranged in an asymmetric structure with the first gate pattern N12 as the center. For example, the first impurity region SD1 may be arranged adjacent to one first sidewall NSW1 of the pair of first sidewalls NSW1 of the first gate pattern N12, and the common impurity region SDC may be arranged adjacent to one second sidewall NSW2 of the pair of second sidewalls NSW2 of the first gate pattern N12. In other words, the first impurity region SD1 may be arranged apart from the first gate pattern N12 in the second direction Y, and the common impurity region SDC may be arranged apart from the first gate pattern N12 in the first direction X.

As the first impurity region SD1 and the common impurity region SDC are arranged in an asymmetric structure with the first gate pattern N12 as the center, when the first NMOS transistor N_1 is turned on, a carrier moving path MD10 having an L shape or an inverted-L shape may be formed from the first impurity region SD1 to the common impurity region SDC, and a carrier may move along the carrier moving path MD10 in both the first direction X and the second direction Y. In addition, as the common impurity region SDC is formed in the second main active region AM2, the carrier moving path MD10 may extend from the common impurity region SDC to the first main active region AM1 via the extended active region AE.

The first offset canceling gate pattern OC12 may include a pair of first sidewalls OSW1 which extend in the second direction Y and are apart from each other in the first direction X. The common impurity region SDC may be arranged in a portion of the second main active region AM2 that is arranged adjacent to one first sidewall OSW1, and a common contact COC may be arranged on the common impurity region SDC. The common impurity region SDC may correspond to a source region or a drain region of the first NMOS transistor N_1, and may also correspond to the source region or drain region of the first offset canceling transistor OC_1.

A second impurity region SD2 may be arranged in a portion of the second main active region AM2 adjacent to the other first sidewall OSW1 of the pair of first sidewalls OSW1, and a second contact CON2 may be disposed on the second impurity region SD2. The second impurity region SD2 may correspond to the source region or drain region of the first offset canceling transistor OC_1. In addition, a third impurity region SD3 may be arranged in a portion of the second main active region AM2 adjacent to a sidewall of the first isolation gate pattern ISO12, and a third contact CON3 may be arranged on the third impurity region SD3. In addition, a gate contact COG1 may be arranged on the first gate pattern N12.

As illustrated in FIGS. 7 and 8, each of the first gate pattern N12, the first offset canceling gate pattern OC12, and the first isolation gate pattern ISO12 may include a gate insulating layer 120P, a gate electrode 130P, and a gate capping layer 142P, and the gate electrode 130P may have a stack structure of a first conductive layer 132P, a second conductive layer 134P, and a third conductive layer 136P. In addition, a gate spacer 138P may be further arranged on a sidewall of the stack structure. The first gate pattern N12, the first offset canceling gate pattern OC12, and the first isolation gate pattern ISO12 may be covered by an interlayer insulating layer 150P.

The gate insulating layer 120P may include at least one of a silicon oxide layer, a silicon nitride layer, a silicon oxynitride layer, an oxide/nitride/oxide (ONO) layer, and a high-k dielectric layer having a higher dielectric constant than the silicon oxide layer. The gate electrode 130P may include the first conductive layer 132P, the second conductive layer 134P, and the third conductive layer 136P. The gate spacer 138P may include silicon nitride, and the gate capping layer 142P may include silicon nitride. Each of first through third contacts CON1, CON2, and CON3, the common contact COC, and the gate contact COG1 may include a conductive barrier layer 162P and a contact conductive layer 164P.

In some example embodiments, constituent materials of the first conductive layer 132P, the second conductive layer 134P, and the third conductive layer 136P of the gate electrode 130P may be the same as constituent materials of a lower conductive pattern 132B (refer to FIG. 15), an intermediate conductive pattern 134B (refer to FIG. 15), and an upper conductive pattern 136B (refer to FIG. 15), which are included in the bit line BL in each cell array area MCA, respectively. Constituent materials of the conductive barrier layer 162P and the contact conductive layer 164P may be the same as those of a conductive barrier layer 162B (refer to FIG. 15) and a landing pad conductive layer 164B (refer to FIG. 15), which are included in a landing pad LP (refer to FIG. 15) in the cell array area MCA, respectively. However, the disclosure is not limited thereto.

As described above, the first NMOS transistor N_1 and the first offset canceling transistor OC_1 may share the common impurity region SDC and the common contact COC. Accordingly, an effective gate length Lg of the first NMOS transistor N_1 may be increased. For example, the effective gate length Lg may be about 10 nm to about 500 nm, but is not limited thereto.

In a related art device, the first NMOS transistor N_1 may include a pair of impurity regions arranged on both sides of the pair of first sidewalls NSW1, and a width of a gate pattern (a width in the second direction Y) may be reduced according to scaling down of an integrated circuit device, and there may be an issue that the effective gate length Lg is also reduced. In this case, due to a relatively short distance between a pair of impurity regions and a channel region, issues may occur that a drain induced barrier lowering (DIBL) phenomenon occurs, and threshold voltages of transistors constituting a sense amplifier increases, or threshold voltage deviation increases.

However, according to example embodiments, as the first impurity region SD1 and the common impurity region SDC are arranged in an asymmetrical structure with the first gate pattern N12 as the center, the first gate pattern N12 may have a relatively large width (or a relatively long effective gate length Lg). In addition, because a relatively long distance is secured between the first gate pattern N12 and the common impurity region SDC, an increase in the threshold voltage due to the DIBL phenomenon may be prevented. Accordingly, transistors constituting the sense amplifier 70 according to example embodiments may have a relatively low threshold voltage or a relatively uniform threshold voltage, and the integrated circuit device 100 including the sense amplifier 70 may have excellent electrical properties.

Figure 9:
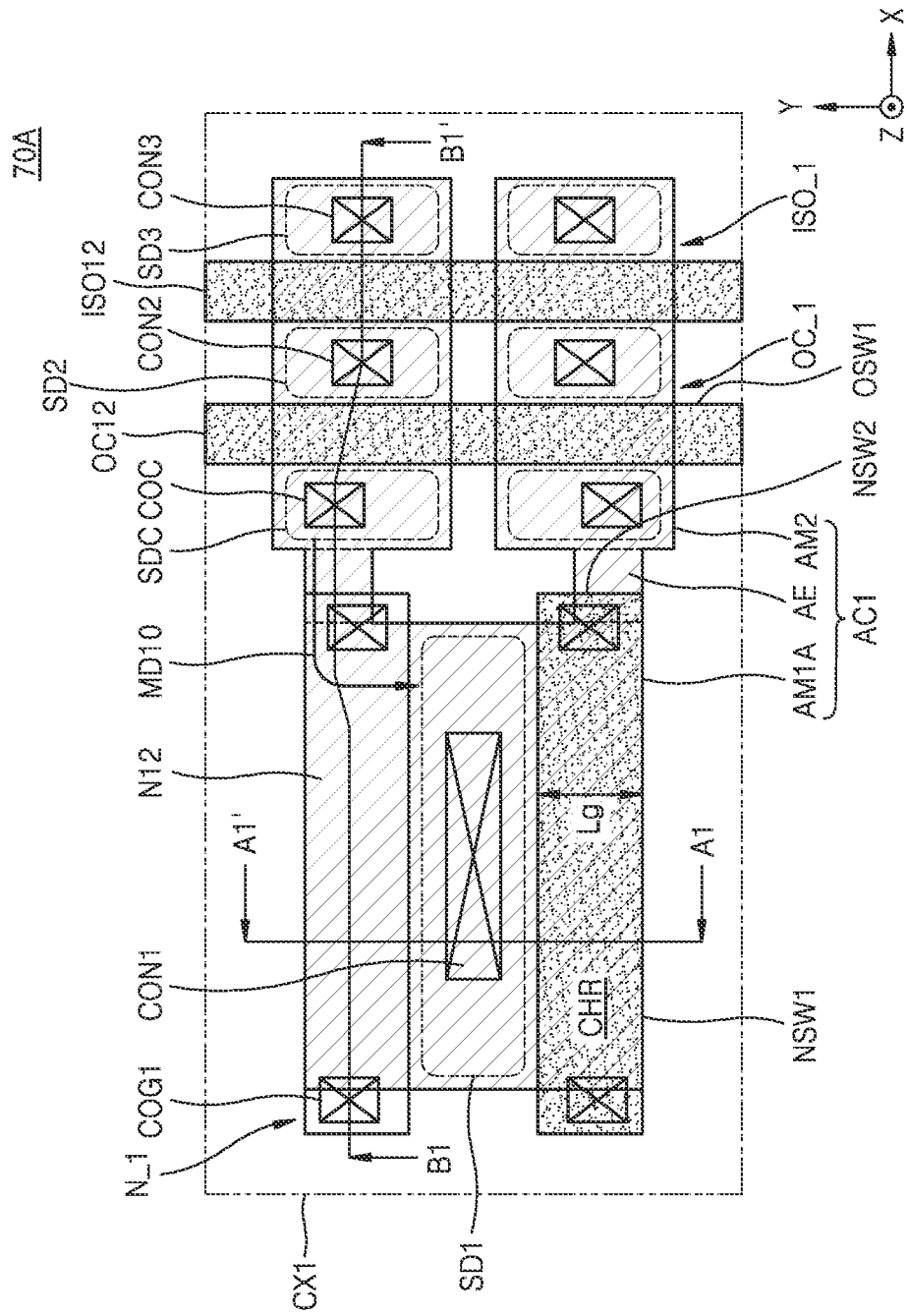
FIG. 9 is a layout diagram of a sense amplifier according to an embodiment.
Figure 10:
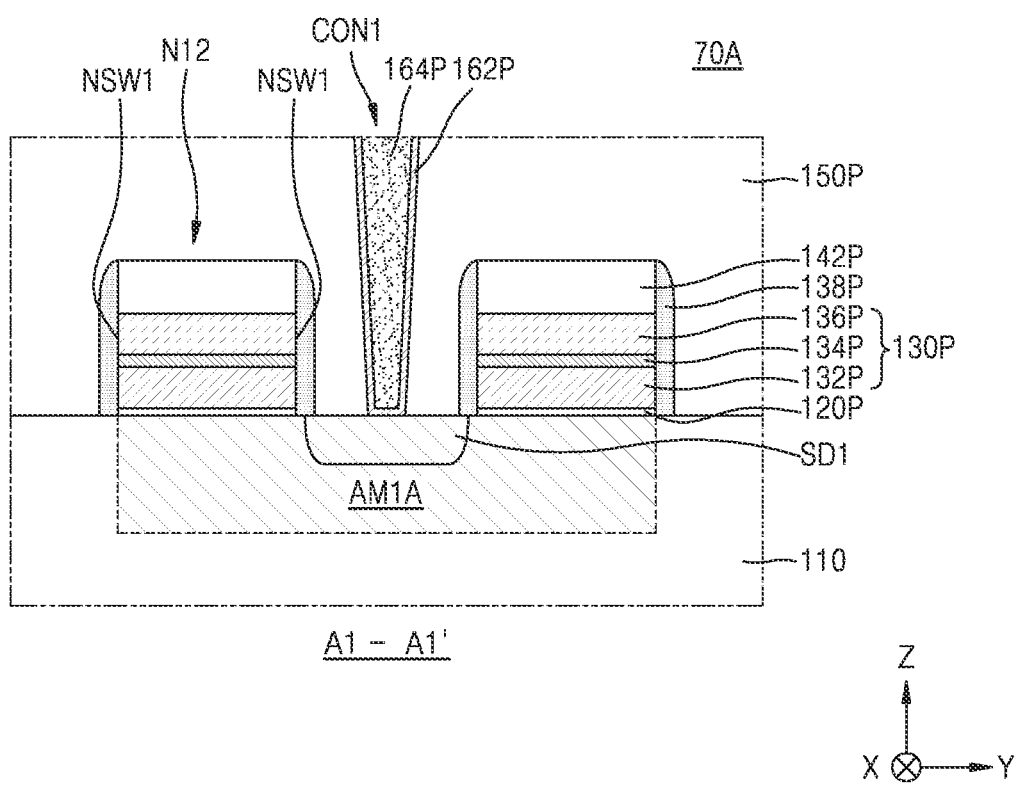
FIG. 10 is a cross-sectional view taken along line A1-A1' in FIG. 9.

FIG. 9 is a layout diagram of a sense amplifier 70A according to an example embodiment, and FIG. 10 is a cross-sectional view taken along line A1-A1' in FIG. 9. In FIGS. 9 and 10, the same reference numerals as those in FIGS. 1 through 8 may denote the same components.

Referring to FIGS. 9 and 10, the first impurity region SD1 may be arranged adjacent to one first sidewall NSW1 of the pair of first sidewalls NSW1 of the first gate pattern N12, and the common impurity region SDC may be arranged adjacent to one second sidewall NSW2 of the pair of second sidewalls NSW2 of the first gate pattern N12. One first sidewall NSW1 of the pair of first sidewalls NSW1 of the first gate pattern N12 and a sidewall of a first main active region AM1A may be aligned with each other. The first main active region AM1A may have a width in the second direction Y that is less than that of the first main active region AM1 illustrated in FIGS. 6 through 8.

In a related art device, the first NMOS transistor N_1 may include a pair of impurity regions arranged on both sides of the pair of first sidewalls NSW1, and a width of a gate pattern (a width in the second direction Y) may be reduced according to scaling down of an integrated circuit device, and there may be an issue that the effective gate length Lg is also reduced.

However, according to example embodiments, as the common impurity region SDC is formed on one side of the pair of second sidewalls NSW2, a sufficient distance between the first gate pattern N12 and the first impurity region SD1 in the second direction Y may be secured, or a width of the first gate pattern N12 in the second direction Y may be increased. Accordingly, a decrease in a threshold voltage due to the DIBL phenomenon may be prevented. Thus, transistors constituting the sense amplifier 70 according to example embodiments may have a relatively low threshold voltage or a relatively uniform threshold voltage.

Figure 11:
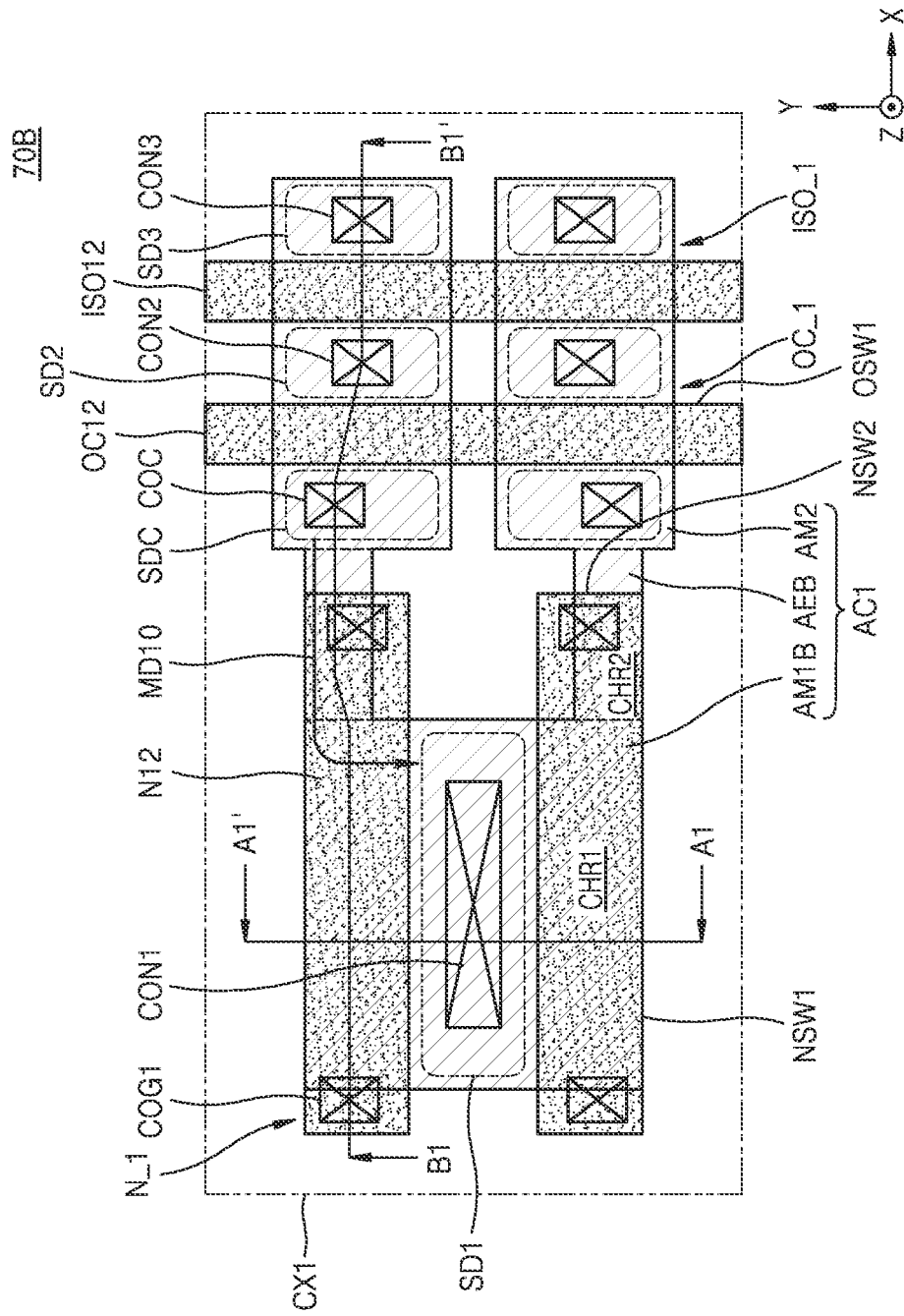
FIG. 11 is a layout diagram of a sense amplifier according to an embodiment.
Figure 12:
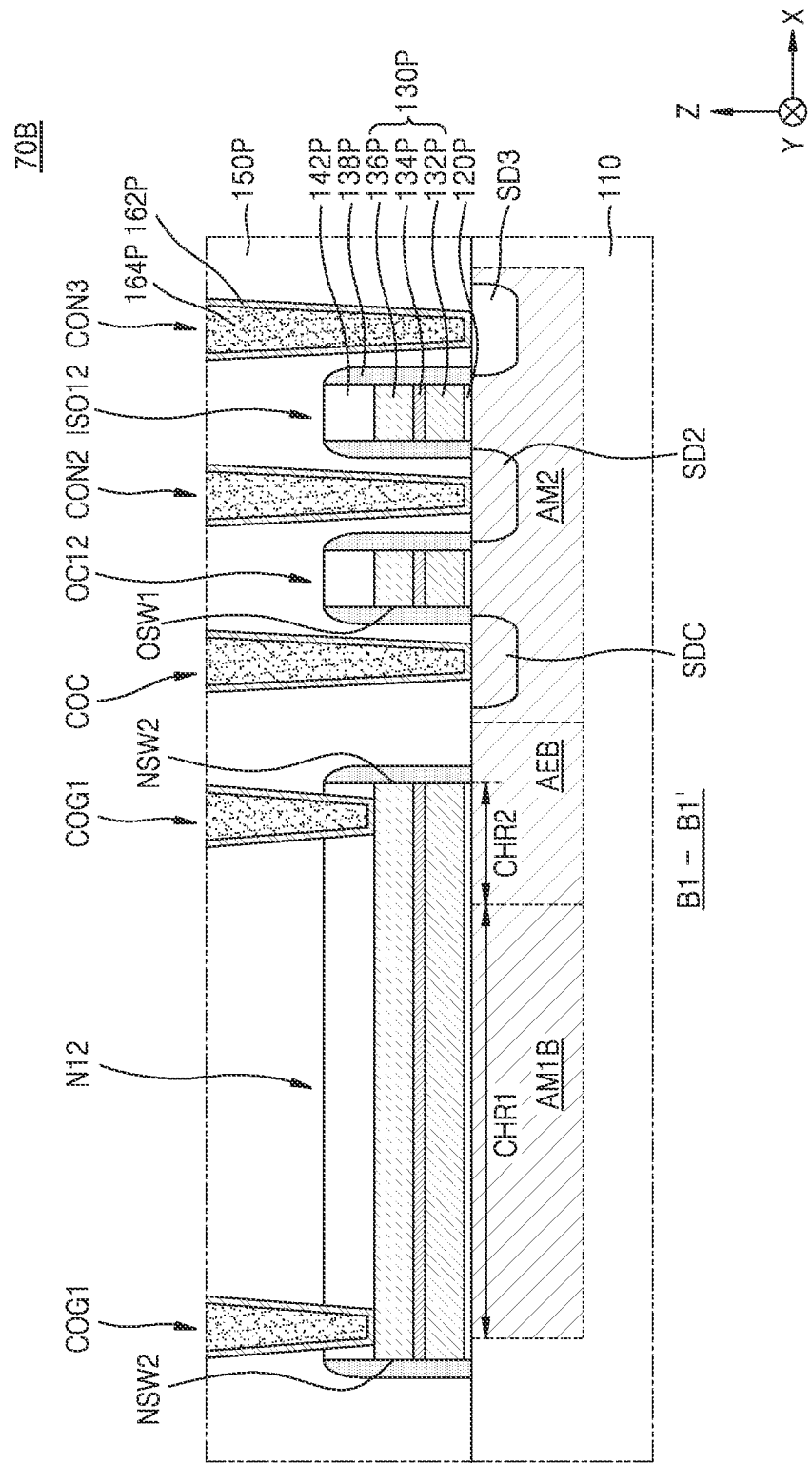
FIG. 12 is a cross-sectional view taken along line B1-B1' in FIG. 11.
Figure 13:
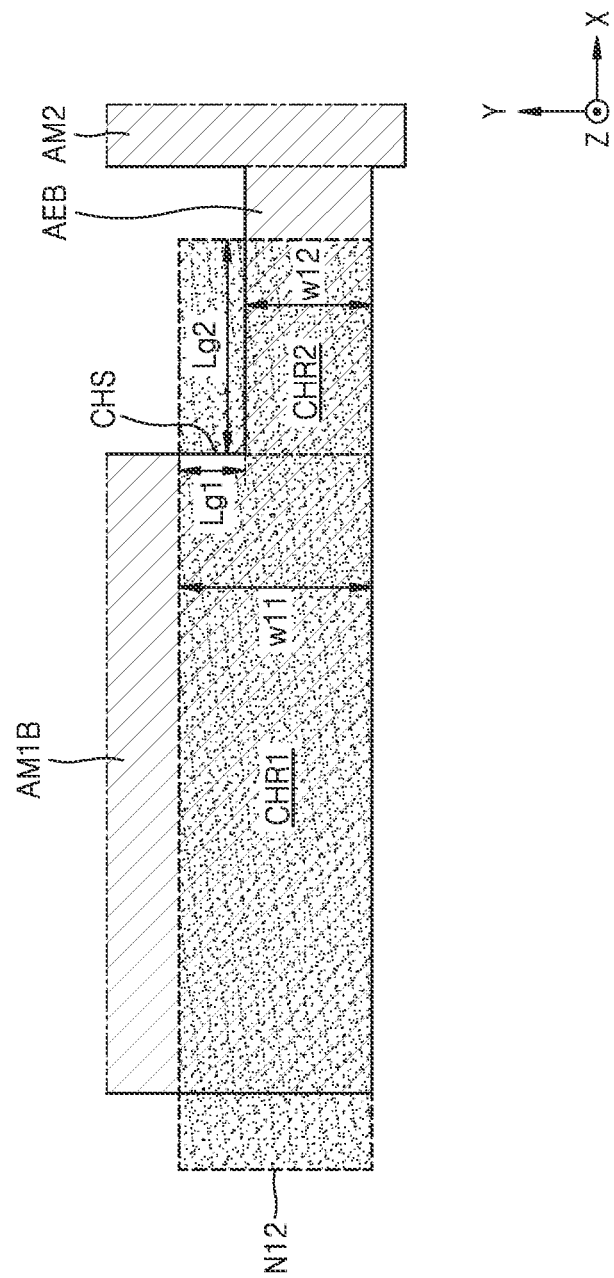
FIG. 13 is a schematic layout diagram of an active region and a first gate pattern in FIG. 11.

FIG. 11 is a layout diagram of a sense amplifier 70B according to an example embodiment, and FIG. 12 is a cross-sectional view taken along line B1-B1' in FIG. 11. FIG. 13 is a schematic layout diagram of the first active region AC1 and the first gate pattern N12 in FIG. 11. In FIGS. 11 through 13, the same reference numerals as those in FIGS. 1 through 10 may denote the same components.

Referring to FIGS. 11 through 13, the first impurity region SD1 may be arranged adjacent to one first sidewall NSW1 of the pair of first sidewalls NSW1 of the first gate pattern N12, and the common impurity region SDC may be arranged adjacent to one second sidewall NSW2 of the pair of second sidewalls NSW2 of the first gate pattern N12. One first sidewall NSW1 of the pair of first sidewalls NSW1 of the first gate pattern N12 and a sidewall of a first main active region AM1B may be aligned with each other.

The first main active region AM1B may have a smaller width in the first direction X than that of the first main active region AM1 illustrated in FIGS. 6 through 8, and an extended active region AEB may have a greater width than that of the extended active region AE illustrated in FIGS. 6 through 8 in the first direction X.

A first channel region CHR1 may be formed in a portion of the first main active region AM1B vertically overlapping the first gate pattern N12, and a second channel region CHR2 may be formed in a portion of the extended active region AEB vertically overlapping the first gate pattern N12. The first channel region CHR1 may have a first width w11 in the second direction Y, the second channel region CHR2 may have a second width w12 in the second direction Y, and the second width w12 may be less than the first width w11 (see FIG. 13). For example, the first width w11 may be about 10 nm to about 500 nm, and the second width w12 may be about 5 nm to about 400 nm, but the embodiment is not limited thereto.

As illustrated in FIG. 13, for example, in a plan view, a step portion CHS having an L shape or an inverse-L shape may be defined at a boundary between the first channel region CHR1 and the second channel region CHR2. The first gate pattern N12 may vertically overlap the step portion CHS, and accordingly, the first NMOS transistor N_1 may have a relatively long effective gate length Lg. For example, the step portion CHS may have a first length Lg1 in the second direction Y and a second length Lg2 in the first direction X, and the effective gate length Lg of the first NMOS transistor N_1 may correspond to a sum of the first length Lg1 and the second length Lg2. Here, the second length Lg2 may indicate a width of the second channel region CHR2 vertically overlapping the first gate pattern N12 in the first direction X, and the first length Lg1 may indicate a difference between the first width w11 of the first channel region CHR1 and the second width w12 of the second channel region CHR2. In some embodiments, the effective gate length Lg of the first NMOS transistor N_1 may be greater than the first width w11 of the first channel region CHR1.

As illustrated in FIG. 11, when the first NMOS transistor N_1 is turned on, the carrier moving path MD10 having an L shape or an inverted-L shape may be formed from the first impurity region SD1 to the common impurity region SDC, and a carrier may move along the carrier moving path MD10 in both the first direction X and the second direction Y. Because the extended active region AEB is formed to have a relatively large width, a length of the carrier moving path MD10 may also be increased.

Figure 14:
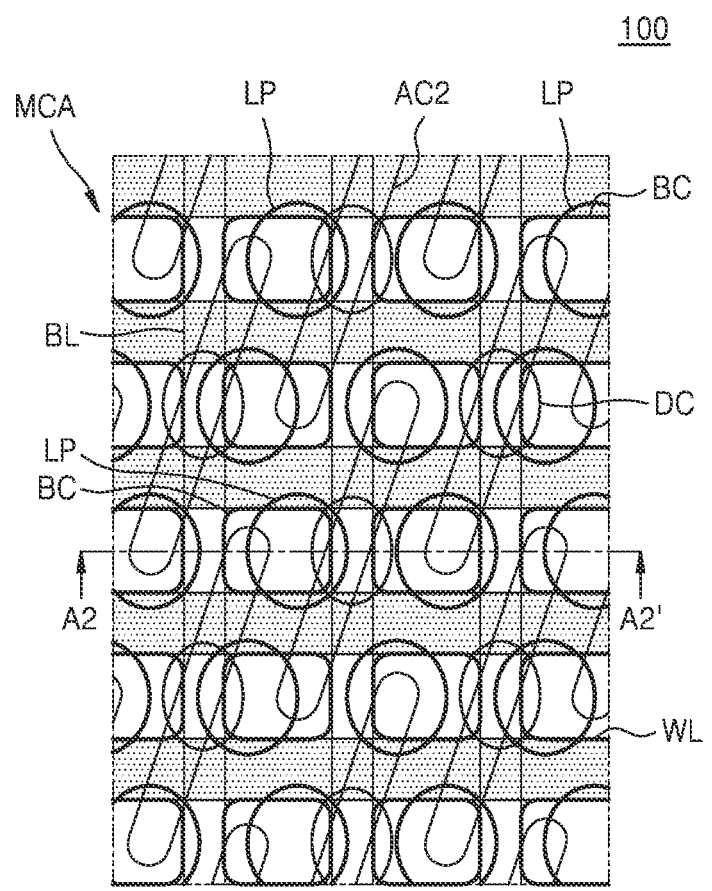
FIG. 14 is a layout diagram of a cell array region of an integrated circuit device, according to an embodiment.
Figure 15:
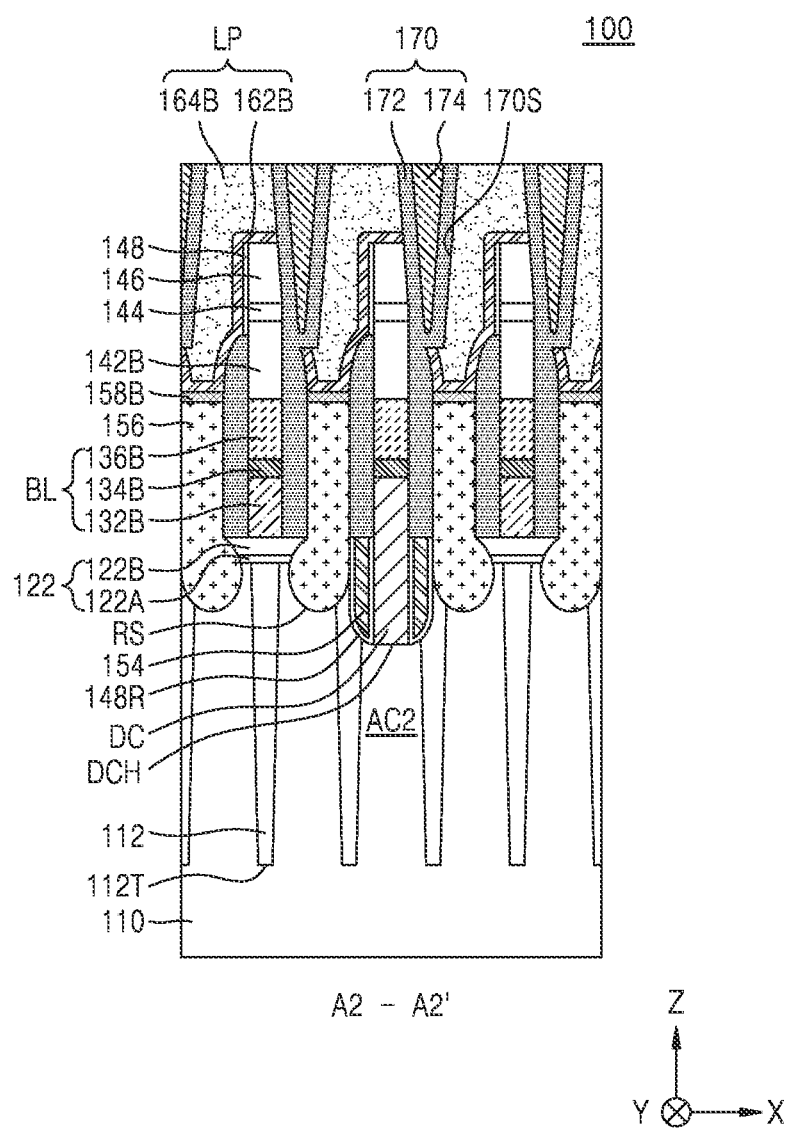
FIG. 15 is a cross-sectional view taken along line A2-A2' in FIG. 14.

FIG. 14 is a layout diagram of the cell array area MCA of the integrated circuit device 100, according to an example embodiment, and FIG. 15 is a cross-sectional view taken along line A2-A2' in FIG. 14.

Referring to FIGS. 14 and 15, the cell array area MCA may include a DRAM device of a buried gate cell array transistor (BCAT) type.

A device isolation trench 112T may be formed in the substrate 110, and a device isolation layer 112 may be formed in the device isolation trench 112T. A plurality of second active regions AC2 may be defined in the substrate 110 in the cell array area MCA by the device isolation layer 112.

Each of the plurality of second active regions AC2 may have a long axis in an oblique direction with respect to the first direction X and the second direction Y. The plurality of word lines WL may extend in parallel with each other in the first direction X across the plurality of first active regions AC1. The plurality of bit lines BL may extend in parallel with each other in the second direction Y on the plurality of word lines WL. The plurality of bit lines BL may be connected to the plurality of first active regions AC1 via direct contacts DC.

A plurality of buried contacts BC may be formed between two adjacent bit lines BL of the plurality of bit lines BL. The plurality of buried contacts BC may be arranged in a line in the first direction X and the second direction Y. A plurality of landing pads LP may be formed on the plurality of buried contacts BC. The plurality of buried contacts BC and the plurality of landing pads LP may connect bottom electrodes of capacitors formed on upper portions of the plurality of bit lines BL to the first active region AC1. The plurality of landing pads LP may partially overlap the plurality of buried contacts BC, respectively.

In the cell array area MCA, a plurality of word line trenches extending in the first direction X are formed in the substrate 110, and a plurality of gate dielectric layers, a plurality of word lines, and a plurality of capping insulating layers may be formed in the plurality of word line trenches. The plurality of word lines may correspond to the plurality of word lines WL illustrated in FIG. 14.

A buffer layer 122 may be formed on the substrate 110 in the cell array area MCA. The buffer layer 122 may include a first insulating layer 122A and a second insulating layer 122B. A plurality of direct contacts DC may be formed in the plurality of direct contact holes DCH in the substrate 110. The plurality of direct contacts DC may be connected to the plurality of second active regions AC2.

A plurality of bit lines BL may extend in the second direction Y on the substrate 110 and the plurality of direct contacts DC. Each of the plurality of bit lines BL may be connected to the second active region AC2 via the direct contact DC. Each of the plurality of bit lines BL may include a lower conductive pattern 132B, an intermediate conductive pattern 134B, and an upper conductive pattern 136B sequentially stacked on the substrate 110. The lower conductive pattern 132B may include doped polysilicon. The intermediate conductive pattern 134B and the upper conductive pattern 136B may each include TiN, TiSiN, W, tungsten silicide, or a combination thereof. In an example embodiment, the intermediate conductive pattern 134B may include TiN, TiSiN, or a combination thereof, and the upper conductive pattern 136B may include W.

Each of the plurality of bit lines BL may be covered by an insulating capping structure. The insulating capping structure may include a lower capping pattern 142B, an insulating layer pattern 144, an upper capping pattern 146, and an insulating liner 148. The lower capping pattern 142B, the insulating layer pattern 144, and the upper capping pattern 146 may be sequentially stacked on the plurality of bit lines BL, and the insulating liner 148 may be arranged on one sidewall of two sidewalls extending in the second direction Y of the lower capping pattern 142B, the insulating layer pattern 144, and the upper capping pattern 146.

The direct contact DC may be formed in the direct contact hole DCH formed in the substrate 110 and may extend to a level higher than an upper surface of the substrate 110. A lower side of the direct contact DC may be surrounded by an insulating liner 148R and a direct contact spacer 154, and an upper side of the direct contact DC may be surrounded by an insulating structure 170 to be described later.

A plurality of conductive plugs 156 and a plurality of insulating fences may be arranged in a row between each of the plurality of bit lines BL in the second direction Y. The plurality of conductive plugs 156 may extend in a vertical direction Z from a recess space RS formed in the substrate 110. The plurality of conductive plugs 156 may constitute the plurality of buried contacts BC illustrated in FIG. 14.

A plurality of metal silicide layers 158B and the plurality of landing pads LP may be formed on the plurality of conductive plugs 156. The metal silicide layer 158B and the landing pad LP may be disposed to vertically overlap the conductive plug 156. The metal silicide layer 158B may include cobalt silicide, nickel silicide, or manganese silicide. Each of the plurality of landing pads LP may be connected to the conductive plug 156 via the metal silicide layer 158B.

The plurality of landing pads LP may cover at least a portion of an upper surface of the upper capping pattern 146 to vertically overlap a portion of the plurality of bit lines BL. Each of the plurality of landing pads LP may include the conductive barrier layer 162B and the landing pad conductive layer 164B. The plurality of landing pads LP may have a plurality of island-type pattern shapes when viewed in a plan view.

The plurality of landing pads LP may be electrically insulated from each other by the insulating structure 170 filling an insulating space 170S around and between the plurality of landing pads LP. The insulating structure 170 may include a first material layer 172 and a second material layer 174. The first material layer 172 may surround both sidewalls of the bit line BL and a sidewall of the landing pad LP, and the second material layer 174 may surround the landing pad LP on the first material layer 172.

Figure 16:
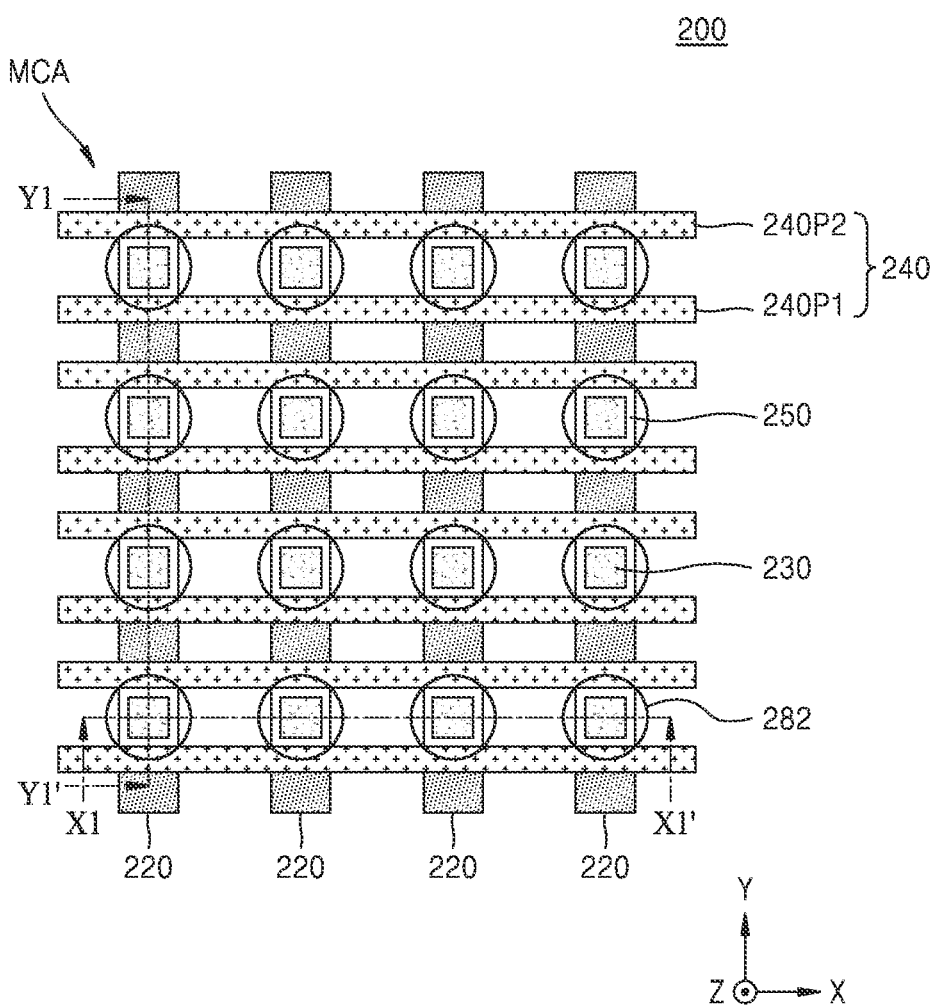
FIG. 16 is a layout diagram of a cell array region of an integrated circuit device, according to an embodiment.
Figure 17:
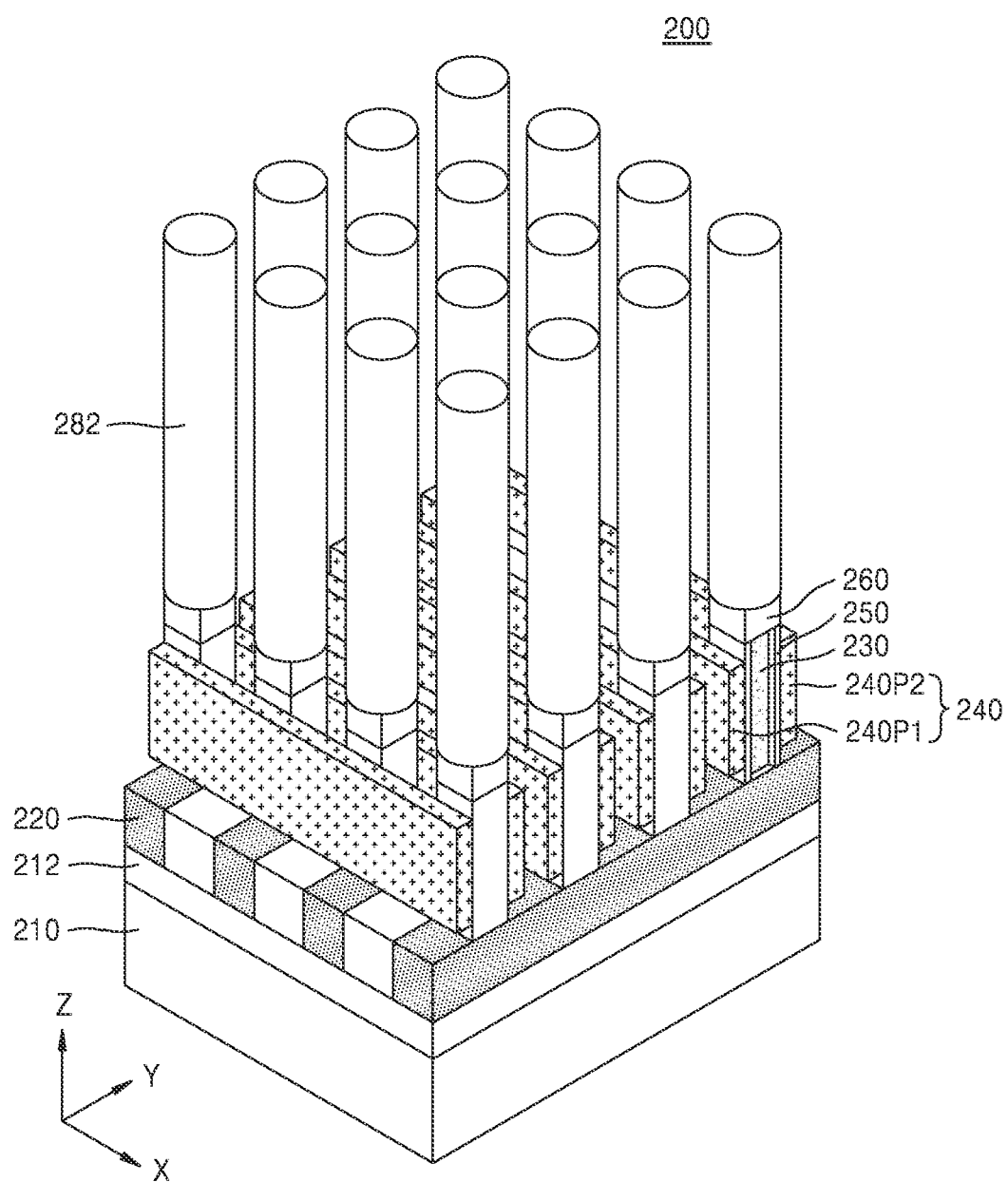
FIG. 17 is a perspective view of an integrated circuit device.
Figure 18:
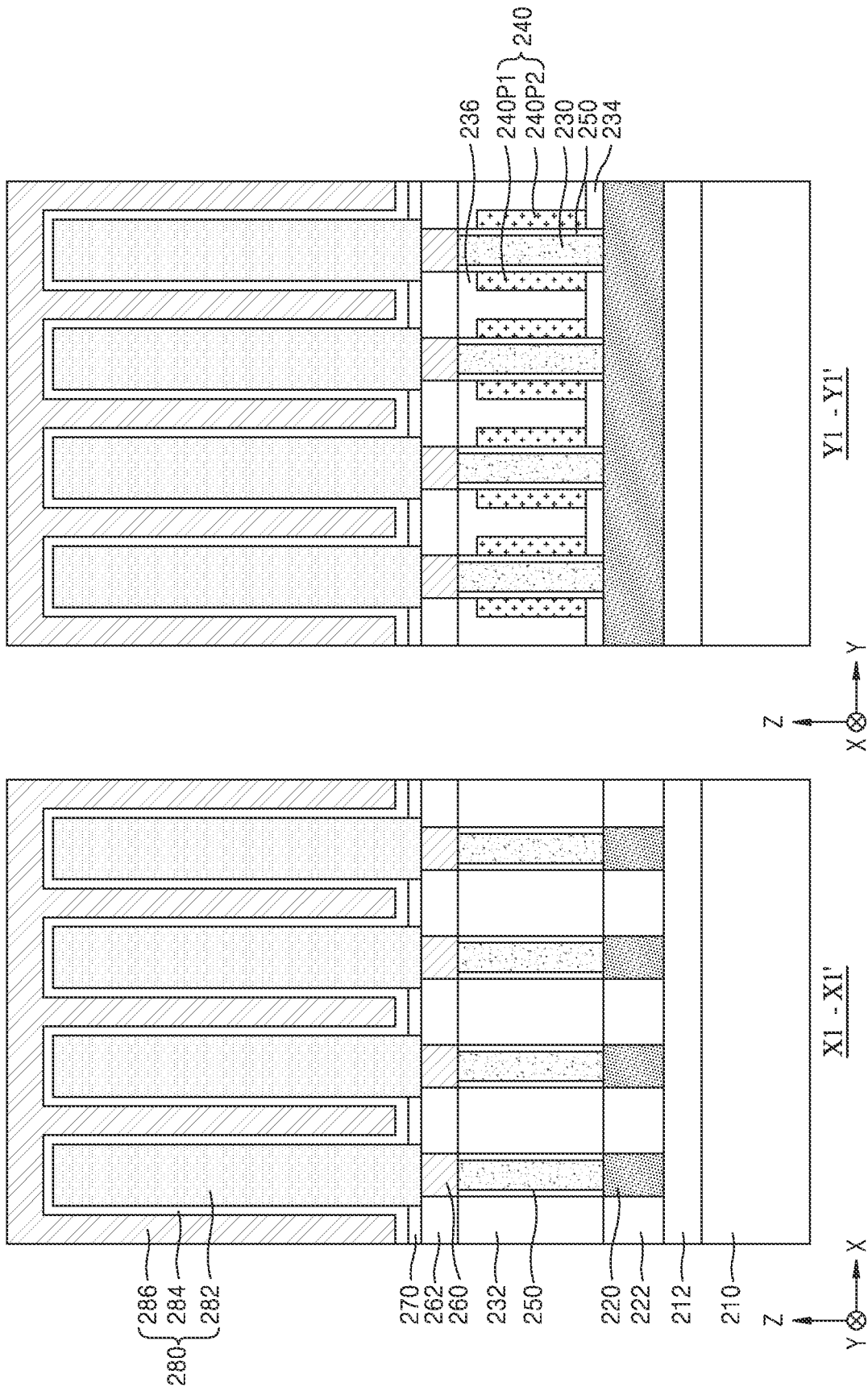
FIG. 18 illustrates cross-sectional views taken along lines X1-X1' and Y1-Y1' in FIG. 16.

FIG. 16 is a layout diagram of the cell array area MCA of an integrated circuit device 200 according to an example embodiment, FIG. 17 is a perspective view of the integrated circuit device 200, and FIG. 18 illustrates cross-sectional views taken along line X1-X1' and line Y1-Y1'.

Referring to FIGS. 16 through 18, the cell array area MCA may include a vertical channel transistor (VCT)-type DRAM device. The VCT may be referred to as a structure in which a channel length of a channel layer 230 extends in the vertical direction Z from a substrate 210. The cell array area MCA may include the substrate 210, a plurality of first conductive lines 220, the channel layer 230, a gate electrode 240, a gate insulating layer 250, and a capacitor structure 280.

A lower insulating layer 212 may be arranged on the substrate 210, and a plurality of first conductive lines 220 may be spaced apart from each other in the first direction X and extend in the second direction Y on the lower insulating layer 212. A plurality of first insulating patterns 222 may be arranged on the lower insulating layer 212 to fill spaces between the plurality of first conductive lines 220. The plurality of first insulating patterns 222 may extend in the second direction Y, and upper surfaces of the plurality of first insulating patterns 222 may be at the same level as upper surfaces of the plurality of first conductive lines 220. The plurality of first conductive lines 220 may function as bit lines of the integrated circuit device 200.

In example embodiments, the plurality of first conductive lines 220 may include doped polysilicon, a metal, conductive metal nitride, conductive metal silicide, conductive metal oxide, or a combination thereof. For example, the plurality of first conductive lines 220 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but are not limited thereto. The plurality of first conductive lines 220 may include a single layer or multiple layers of the aforementioned materials. In example embodiments, the plurality of first conductive lines 220 may include a two-dimensional (2D) semiconductor material, and for example, the 2D semiconductor material may include graphene or carbon nanotube, or a combination thereof.

The channel layer 230 may be arranged in a matrix form spaced apart from each other in the first direction X and the second direction Y on the plurality of first conductive lines 220. The channel layer 230 may have a first width in the first direction X and a first height in the third direction Z, and the first height may be greater than the first width. For example, the first height may be about 2 to about 10 times the first width, but is not limited thereto. A bottom portion of the channel layer 230 may function as a first source/drain region, an upper portion of the channel layer 230 may function as a second source/drain region, and a portion of the channel layer 230 between the first and second source/drain regions may function as a channel region.

In example embodiments, the channel layer 230 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 230 may include a single layer or multiple layers of the oxide semiconductor. In some example embodiments, the channel layer 230 may have a bandgap energy greater than that of silicon. For example, the channel layer 230 may have a band gap energy of about 1.5 eV to about 5.6 eV. For example, when the channel layer 230 has a band gap energy of about 2.0 eV to about 4.0 eV, the channel layer 230 may have optimal channel performance. For example, the channel layer 230 may be polycrystalline or amorphous, but is not limited thereto. In example embodiments, the plurality of channel layers 230 may include a 2D semiconductor material, and the 2D semiconductor material may include, for example, graphene or carbon nanotube, or a combination thereof.

The gate electrode 240 may extend on both sidewalls of the channel layer 230 in the first direction X. The gate electrode 240 may include a first sub-gate electrode 240P1 facing a first sidewall of the channel layer 230 and a second sub-gate electrode 240P2 facing a second sidewall opposite to the first sidewall of the channel layer 230. As one channel layer 230 is arranged between the first sub-gate electrode 240P1 and the second sub-gate electrode 240P2, the integrated circuit device 200 may have a dual gate transistor structure. However, the disclosure is not limited thereto, and a single gate transistor structure may be implemented by omitting the second sub-gate electrode 240P2 and forming only the first sub-gate electrode 240P1 facing the first sidewall of the channel layer 230.

The gate electrode 240 may include doped polysilicon, a metal, conductive metal nitride, conductive metal silicide, conductive metal oxide, or a combination thereof. For example, the gate electrode 240 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The gate insulating layer 250 may surround a sidewall of the channel layer 230, and may be arranged between the channel layer 230 and the gate electrode 240. In example embodiments, the gate insulating layer 250 may include a silicon oxide layer, a silicon oxynitride layer, a high-k dielectric layer having a dielectric constant higher than that of the silicon oxide layer, or a combination thereof. The high-k dielectric layer may include a metal oxide or a metal oxynitride. For example, the high-k dielectric layer usable as the gate insulating layer 250 may include $HfO_2$, HfSiO, HfSiON, HfTaO, HfTiO, HfZrO, $ZrO_2$, $Al_2O_3$, or a combination thereof, but is not limited thereto.

A plurality of second insulating patterns 232 may extend on the plurality of second insulating pattern 232 in the second direction Y, and a channel layer 230 may be arranged between two adjacent second insulating patterns 232 to each other of the plurality of second insulating patterns 232. In addition, a first buried layer 234 and a second buried layer 236 may be arranged in a space between two channel layers 230 adjacent to each other, between two adjacent second insulating patterns 232. The first buried layer 234 may be arranged at the bottom of a space between two adjacent channel layers 230, and the second buried layer 236 may be formed to fill the rest of the space between two adjacent channel layers 230 on the first buried layer 234. An upper surface of the second buried layer 236 may be arranged at the same level as an upper surface of the channel layer 230, and the second buried layer 236 may cover an upper surface of the gate electrode 240. In contrast, the plurality of second insulating patterns 232 may be formed as a material layer continuous with the plurality of first insulating patterns 222. As another example, the second buried layer 236 may be formed as a material layer continuous with the first buried layer 234.

A capacitor contact 260 may be arranged on the channel layer 230. The capacitor contacts 260 may be arranged to vertically overlap the channel layers 230, and may be arranged apart from each other in a matrix form in the first direction X and the second direction Y. The capacitor contact 260 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. An upper insulating layer 262 may surround sidewalls of the capacitor contact 260 on the plurality of second insulating patterns 232 and the plurality of second buried layers 236.

An etch stop layer 270 may be arranged on the upper insulating layer 262, and a capacitor structure 280 may be arranged on the etch stop layer 270. The capacitor structure 280 may include a lower electrode 282, a capacitor dielectric layer 284, and an upper electrode 286.

The lower electrode 282 may penetrate the etch stop layer 270, and be electrically connected to an upper surface of the capacitor contact 260. The lower electrode 282 may be formed in a pillar type extending in the third direction Z, but is not limited thereto. In example embodiments, the lower electrodes 282 may be arranged to vertically overlap the capacitor contacts 260, and may be arranged apart from each other in a matrix form in the first direction X and the second direction Y. As another example, a landing pad may be further arranged between the capacitor contact 260 and the lower electrode 282 so that the lower electrode 282 is arranged in a hexagonal shape.

Figure 19:
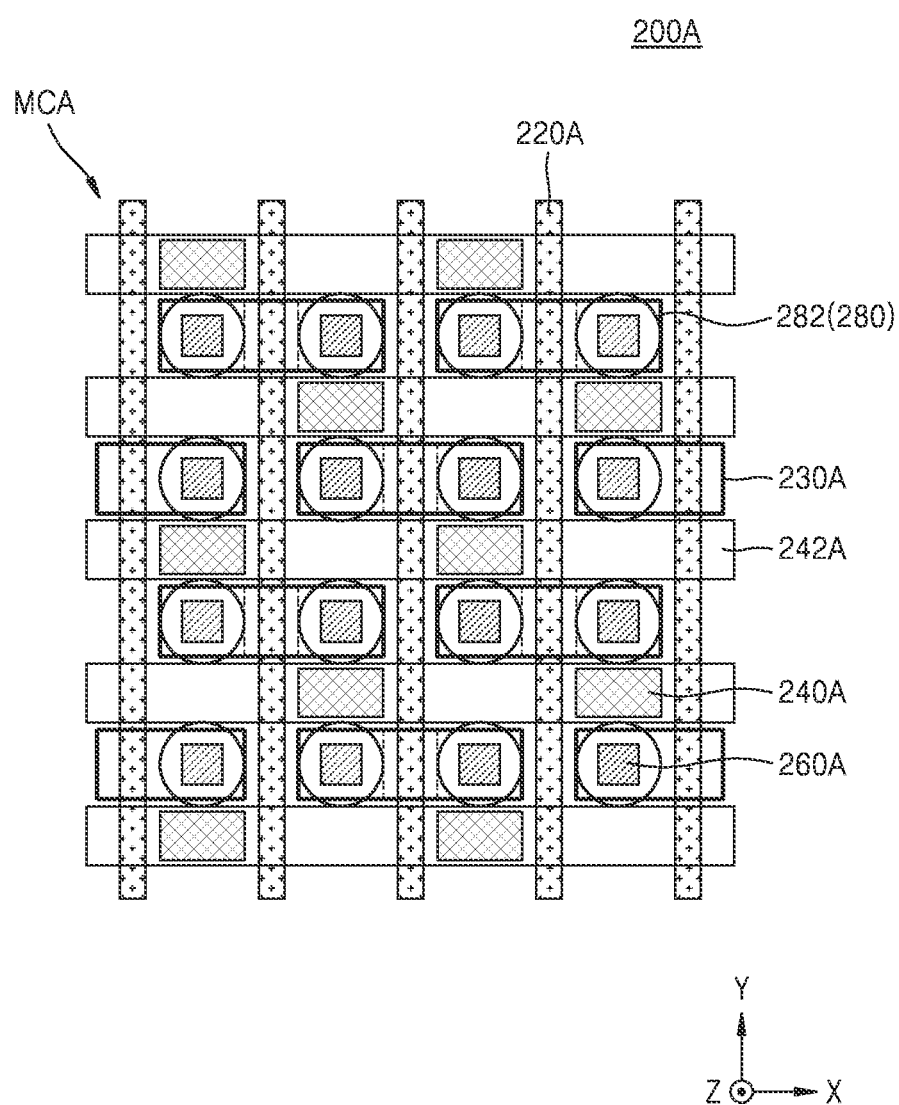
FIG. 19 is a layout diagram of a cell array region of an integrated circuit device, according to an embodiment.
Figure 20:
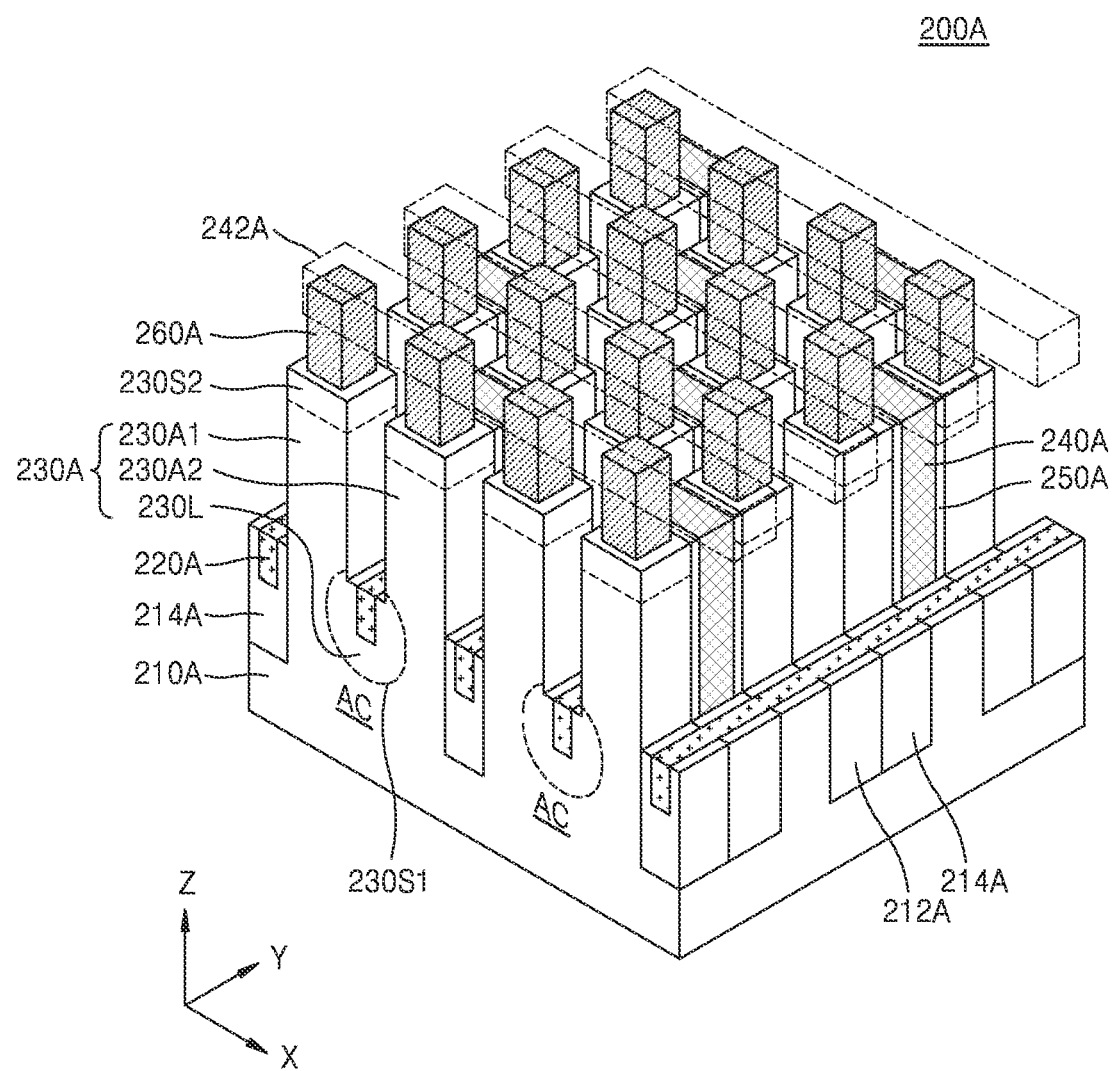
FIG. 20 is a perspective view of an integrated circuit device.

FIG. 19 is a layout diagram of the cell array area MCA of an integrated circuit device 200A according to an example embodiment, and FIG. 20 is a perspective view of the integrated circuit device 200A.

Referring to FIGS. 19 and 20, the cell array area MCA may include a VCT-type DRAM device. The cell array area MCA may include a substrate 210A, a plurality of first conductive lines 220A, a channel structure 230A, a contact gate electrode 240A, a plurality of second conductive lines 242A, and the capacitor structure 280.

A plurality of active regions AC may be defined on the substrate 210A by the first device isolation layer 212A and the second device isolation layer 214A. The channel structure 230A may be arranged in each active area AC, and the channel structure 230A may include a first active pillar 230A1 and a second active pillar 230A2 respectively extending in the vertical direction Z, and a connection unit 230L connected to a bottom of the first active pillar 230A1 and a bottom of the second active pillar 230A2. A first impurity region 230S1 may be arranged in the connection unit 230L, and a second impurity region 230S2 may be arranged in upper portions of first and second active pillars 230A1 and 230A2. Each of the first active pillar 230A1 and the second active pillar 230A2 may constitute an independent unit memory cell.

The plurality of first conductive lines 220A may extend in a direction crossing each of the plurality of active regions AC, for example, in the second direction Y. One first conductive line 220A of the plurality of first conductive lines 220A may be arranged on the connection unit 230L between the first active pillar 230A1 and the second active pillar 230A2, and the one first conductive line 220A may be arranged on the first impurity region 230S1. Another first conductive line 220A adjacent to the one first conductive line 220A may be arranged between two channel structures 230A. One first conductive line 220A of the plurality of first conductive lines 220A may function as a common bit line included in two unit memory cells that are constituted by the first active pillar 230A1 and the second active pillar 230A2 arranged on both sides of the one first conductive line 220A.

One contact gate electrode 240A may be arranged between the two adjacent channel structures 230A in the second direction Y. For example, the contact gate electrode 240A may be arranged between the first active pillar 230A1 included in one channel structure 230A and the second active pillar 230A2 of the channel structure 230A adjacent to the first active pillar 230A1, and the one contact gate electrode 240A may be shared by the first active pillar 230A1 and the second active pillar 230A2 arranged on both sidewalls thereof. A gate insulating layer 250A may be arranged between the contact gate electrode 240A and the first active pillar 230A1, and between the contact gate electrode 240A and the second active pillar 230A2. The plurality of second conductive lines 242A may extend on an upper surface of the contact gate electrode 240A in the first direction X. The plurality of second conductive lines 242A may function as word lines of the integrated circuit device 200A.

A capacitor contact 260A may be arranged on the channel structure 230A. The capacitor contact 260A may be arranged on the second impurity region 230S2, and the capacitor structure 280 may be arranged on the capacitor contact 260A.

While the disclosure has been particularly shown and described with reference to embodiments thereof, it will be understood that various changes in form and details may be made therein without departing from the spirit and scope of the following claims.

What is claimed is:

1. An integrated circuit device comprising a sense amplifier configured to sense a voltage change of a bit line, wherein the sense amplifier comprises:
   a substrate in which a first active region is defined;
   a sense amplifier unit connected to the bit line and a complementary bit line, the sense amplifier unit being configured to sense the voltage change of the bit line in response to a control signal and adjust voltages of a sensing bit line and a complementary sensing bit line based on the sensed voltage change, the sense amplifier unit comprising a first PMOS transistor and a first NMOS transistor; and
   a first offset canceling unit connecting the bit line to the complementary sensing bit line in response to an offset canceling signal, the first offset canceling unit comprising a first offset canceling transistor arranged between the first NMOS transistor and the first PMOS transistor,
   wherein the first offset canceling transistor shares a common impurity region with the first NMOS transistor,
   wherein the first active region comprises a first main active region, a second main active region, and an extended active region arranged between the first main active region and the second main active region,
   wherein the first NMOS transistor is arranged in the first main active region, and
   wherein the first offset canceling transistor is arranged in the second main active region.

2. The integrated circuit device of claim 1, wherein the first NMOS transistor comprises:
   a first gate pattern arranged on the first main active region, the first gate pattern comprising a pair of first sidewalls extending in a first direction in parallel with an upper surface of the substrate and a pair of second sidewalls extending in a second direction in parallel with the upper surface of the substrate;
   a first impurity region arranged in a first upper portion of the substrate and adjacent to one first sidewall of the pair of first sidewalls of the first gate pattern; and
   the common impurity region arranged in a second upper portion of the substrate adjacent to one second sidewall of the pair of second sidewalls of the first gate pattern.

3. The integrated circuit device of claim 2, wherein the first offset canceling transistor comprises:
   a first offset canceling gate pattern arranged on the second main active region, the first offset canceling gate pattern comprising a pair of third sidewalls extending in the second direction;
   the common impurity region arranged adjacent to one third sidewall of the pair of third sidewalls; and
   a second impurity region arranged adjacent to the other third sidewall of the pair of third sidewalls of the first offset canceling gate pattern.

4. The integrated circuit device of claim 3, wherein the sense amplifier further comprises:
   a first contact arranged on the first impurity region;
   a common contact arranged on the common impurity region; and
   a second contact arranged on the second impurity region.

5. The integrated circuit device of claim 4, wherein the common impurity region is arranged in a portion of the second main active region,
wherein the first contact is arranged adjacent to the one first sidewall of the pair of first sidewalls of the first gate pattern, and
wherein the common contact is arranged adjacent to the one second sidewall of the pair of second sidewalls of the first gate pattern.

6. The integrated circuit device of claim 3, wherein the first active region comprises a channel region overlapping the first gate pattern,
wherein the channel region comprises a first channel region having a first width in the second direction and a second channel region having a second width less than the first width in the second direction, and
wherein, in a plan view, a step portion having an L-shape is defined at a boundary between the first channel region and the second channel region.

7. The integrated circuit device of claim 6, wherein a sum of a length of the step portion in the first direction and a length of the step portion in the second direction is greater than the first width of the first channel region.

8. The integrated circuit device of claim 7, wherein the first NMOS transistor has an effective gate length greater than the first width.

9. The integrated circuit device of claim 1, wherein the sense amplifier unit further comprises a second PMOS transistor and a second NMOS transistor,
wherein the first PMOS transistor is connected between a first control signal line and the complementary sensing bit line,
wherein a first gate pattern of the first PMOS transistor is connected to the sensing bit line,
wherein the second PMOS transistor is connected between the first control signal line and the sensing bit line,
wherein a second gate pattern of the second PMOS transistor is connected to the complementary sensing bit line,
wherein the first NMOS transistor is connected between a second control signal line and the complementary sensing bit line,
wherein a third gate pattern of the first NMOS transistor is connected to the bit line,
wherein the second NMOS transistor is connected between the second control signal line and the sensing bit line, and
wherein a fourth gate pattern of the second NMOS transistor is connected to the complementary bit line.

10. An integrated circuit device comprising a sense amplifier configured to sense a voltage change of a bit line, wherein the sense amplifier comprises:
a sense amplifier unit connected to the bit line and a complementary bit line, the sense amplifier unit being configured to sense the voltage change of the bit line in response to a control signal and adjust voltages of a sensing bit line and a complementary sensing bit line based on the sensed voltage change, the sense amplifier unit comprising a first NMOS transistor; and
a first offset canceling unit connecting the bit line to the complementary sensing bit line in response to an offset canceling signal, the first offset canceling unit comprising a first offset canceling transistor arranged adjacent to the first NMOS transistor,
wherein the first NMOS transistor comprises:
a first gate pattern arranged on a first active region of a substrate, the first gate pattern comprising a pair of first sidewalls extending in a first direction in parallel with an upper surface of the substrate and a pair of second sidewalls extending in a second direction in parallel with the upper surface of the substrate;
a first impurity region arranged in a first upper portion of the substrate and adjacent to one first sidewall of the pair of first sidewalls of the first gate pattern; and
a common impurity region arranged in a second upper portion of the substrate and adjacent to one second sidewall of the pair of second sidewalls of the first gate pattern.

11. The integrated circuit device of claim 10, wherein the first offset canceling transistor comprises a first offset canceling gate pattern arranged on the first active region of the and a pair of third sidewalls extending in the second direction,
wherein the first gate pattern extends in the first direction, and
wherein the first offset canceling gate pattern extends in the second direction.

12. The integrated circuit device of claim 11, wherein the first offset canceling transistor further comprises:
the common impurity region arranged adjacent to one third sidewall of the pair of third sidewalls of the first offset canceling gate pattern; and
a second impurity region arranged adjacent to the other third sidewall of the pair of third sidewalls of the first offset canceling gate pattern.

13. The integrated circuit device of claim 11, wherein the first active region comprises a first main active region, a second main active region, and an extended active region arranged between the first main active region and the second main active region,
wherein the first gate pattern is arranged on the first main active region, and
wherein the first offset canceling gate pattern is arranged on the second main active region.

14. The integrated circuit device of claim 13, wherein the first active region comprises a channel region overlapping the first gate pattern,
wherein the channel region comprises a first channel region having a first width in the second direction and a second channel region having a second width less than the first width in the second direction, and
wherein, in a plan view, a step portion having an L-shape is defined at a boundary between the first channel region and the second channel region.

15. The integrated circuit device of claim 13, further comprising:
a first contact arranged on the first impurity region adjacent to the one first sidewall of the pair of first sidewalls of the first gate pattern; and
a common contact arranged on the common impurity region and adjacent to the one second sidewall of the pair of second sidewalls of the first gate pattern.

16. An integrated circuit device comprising a sense amplifier configured to sense a voltage change of a bit line, wherein the sense amplifier comprises:
a sense amplifier unit connected to the bit line and a complementary bit line, the sense amplifier unit being configured to sense the voltage change of the bit line in response to a control signal and adjust voltages of a sensing bit line and a complementary sensing bit line based on the sensed voltage change, the sense amplifier unit comprising a first PMOS transistor, a second PMOS transistor, a first NMOS transistor, and a second NMOS transistor; and a first offset canceling unit connecting the bit line to the complementary sensing bit line in response to an offset canceling signal, the first offset canceling unit comprising a first offset canceling transistor arranged adjacent to the first NMOS transistor, wherein the first PMOS transistor is connected between a first control signal line and the complementary sensing bit line, wherein a first gate pattern of the first PMOS transistor is connected to the sensing bit line, wherein the second PMOS transistor is connected between the first control signal line and the sensing bit line, wherein a second gate pattern of the second PMOS transistor is connected to the complementary sensing bit line, wherein the first NMOS transistor is connected between a second control signal line and the complementary sensing bit line, wherein a third gate pattern of the first NMOS transistor is connected to the bit line, wherein the second NMOS transistor is connected between the second control signal line and the sensing bit line, wherein a fourth gate pattern of the second NMOS transistor is connected to the complementary bit line, and wherein the first NMOS transistor comprises:
the third gate pattern arranged on a first active region of a substrate, the third gate pattern comprising a pair of first sidewalls extending in a first direction in parallel with an upper surface of the substrate and a pair of second sidewalls extending in a second direction in parallel with the upper surface of the substrate;

a first impurity region arranged in a first upper portion of the substrate and adjacent to one first sidewall of the pair of first sidewalls of the third gate pattern; and a common impurity region arranged in a second upper portion of the substrate and adjacent to one second sidewall of the pair of second sidewalls of the third gate pattern.

17. The integrated circuit device of claim 16, wherein the first offset canceling transistor further comprises:
a first offset canceling gate pattern arranged on the first active region of the substrate, the first offset canceling gate pattern comprising a pair of third sidewalls extending in the second direction;

the common impurity region arranged adjacent to one third sidewall of the pair of third sidewalls of the first offset canceling gate pattern; and a second impurity region arranged adjacent to the other third sidewall of the pair of third sidewalls of the first offset canceling gate pattern.

18. The integrated circuit device of claim 17, wherein the sense amplifier further comprises a common contact arranged on the common impurity region, and
wherein the first NMOS transistor and the first offset canceling transistor share the common impurity region and the common contact.

19. The integrated circuit device of claim 17, wherein the first active region comprises:
a first main active region vertically overlapping the first gate pattern;

a second main active region vertically overlapping the first offset canceling gate pattern; and an extended active region arranged between the first main active region and the second main active region, wherein a width of the extended active region in the second direction is less than a width of the second main active region in the second direction.

\* \* \* \* \*